US011175335B2

(12) United States Patent
Biskeborn et al.

(10) Patent No.: US 11,175,335 B2
(45) Date of Patent: Nov. 16, 2021

(54) DIAGNOSTICS IN TMR SENSORS

(71) Applicant: International Business Machines Corporation, Armonk, NY (US)

(72) Inventors: Robert G. Biskeborn, Hollister, CA (US); Wlodzimierz S. Czarnecki, Palo Alto, CA (US); Icko E. T. Iben, Santa Clara, CA (US); Hugo E. Rothuizen, Oberrieden (CH)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 16/445,586

(22) Filed: Jun. 19, 2019

(65) Prior Publication Data

US 2019/0369161 A1    Dec. 5, 2019

Related U.S. Application Data

(62) Division of application No. 15/193,620, filed on Jun. 27, 2016, now Pat. No. 10,422,829.

(51) Int. Cl.
  *G01R 31/28*   (2006.01)
  *G01R 33/00*   (2006.01)
  *G01R 33/09*   (2006.01)

(52) U.S. Cl.
  CPC ..... *G01R 31/2829* (2013.01); *G01R 33/0035* (2013.01); *G01R 33/098* (2013.01)

(58) Field of Classification Search
  CPC .............. G01R 33/098; G01R 33/0035; G01R 31/2829; G01R 31/28; G01R 33/00;
  (Continued)

(56) References Cited

U.S. PATENT DOCUMENTS 6,101,062 A * 8/2000 Jen ................. G11B 21/025
                                                          360/75
6,178,074 B1   1/2001 Gill
(Continued)

FOREIGN PATENT DOCUMENTS

JP   2004242189 B2   8/2004
JP   2005340430 A   12/2005
(Continued)

OTHER PUBLICATIONS

Childress et al., "Low-resistance IrMn and PtMn tunnel valves for recording head applications", Journal of Applied Physics, vol. 89, No. 11, Jun. 1, 2001, DOI: 10.1063/1.1361050, 5 pages, retrieved on Feb. 4, 2016, © 2001 American Institute of Physics.
(Continued)

*Primary Examiner* — Lee E Rodak
*Assistant Examiner* — Brent J Andrews
(74) *Attorney, Agent, or Firm* — Peter K. Suchecki

(57) ABSTRACT

A computer-implemented method includes, by one or more processors in electronic communication with a tunneling magnetoresistive sensor, wherein the tunneling magnetoresistive sensor is a component of a magnetic storage drive configured to read magnetic data from a magnetic storage medium, detecting a short across the tunneling magnetoresistive sensor, measuring a change in resistance of the tunneling magnetoresistive sensor, measuring a change in voltage amplitude for the tunneling magnetoresistive sensor, and dividing said change in voltage amplitude by said change in resistance to yield a ratio. The computer-implemented method further includes, responsive to the ratio being greater than a predetermined ratio threshold, determining that the short is caused by a magnetic shunt. A corresponding computer program product and computer system are also disclosed.

11 Claims, 20 Drawing Sheets

(58) Field of Classification Search
CPC .. G01R 33/09; G01R 35/005; G01R 31/2884; G01R 33/072; G01D 5/2448; G01D 5/2449; G01D 5/145
See application file for complete search history.

(56) References Cited

U.S. PATENT DOCUMENTS

| | | | |
|---|---|---|---|
| 6,275,028 B1* | 8/2001 | Matsui | B82Y 10/00 29/603.08 |
| 6,473,257 B1 | 10/2002 | Shimazawa | |
| 6,741,433 B1 | 5/2004 | Nishioka | |
| 6,903,889 B2 | 6/2005 | Li | |
| 6,960,480 B1 | 11/2005 | Horng | |
| 7,372,282 B2 | 5/2008 | Hachisuka | |
| 7,417,442 B2 | 8/2008 | Hachisuka | |
| 7,804,657 B1 | 9/2010 | Hogg | |
| 7,872,824 B1 | 1/2011 | Macchioni | |
| 8,044,816 B2 | 10/2011 | Axtman | |
| 8,120,353 B2 | 2/2012 | Iben | |
| 8,331,064 B2 | 12/2012 | Iben | |
| 8,902,531 B2 | 12/2014 | Bui | |
| 8,988,835 B1 | 3/2015 | Biskeborn et al. | |
| 9,214,172 B2 | 12/2015 | Li | |
| 9,418,685 B1 | 8/2016 | Ahmad | |
| 9,530,440 B1 | 12/2016 | Ahmad | |
| 9,613,655 B1* | 4/2017 | Ahmad | G11B 20/1816 |
| 9,685,201 B2 | 6/2017 | Iben | |
| 9,865,282 B2 | 1/2018 | Ahmad | |
| 9,915,697 B2 | 3/2018 | Biskeborn | |
| 2006/0002333 A1 | 1/2006 | Skog | |
| 2006/0088735 A1 | 4/2006 | Endou | |
| 2008/0186634 A1 | 8/2008 | Axtman et al. | |
| 2008/0273265 A1 | 11/2008 | Gee | |
| 2009/0268324 A1* | 10/2009 | Iben | G11B 5/00826 360/31 |
| 2011/0285394 A1 | 11/2011 | Iben | |
| 2012/0280675 A1 | 11/2012 | Berman | |
| 2016/0093320 A1 | 3/2016 | Aria | |
| 2016/0118067 A1 | 4/2016 | Iben | |
| 2017/0011777 A1 | 1/2017 | Icko | |
| 2017/0125040 A1 | 5/2017 | Ahmad | |
| 2017/0370984 A1 | 12/2017 | Biskeborn | |
| 2018/0113167 A1 | 4/2018 | Biskeborn | |
| 2018/0120370 A1 | 5/2018 | Biskeborn | |
| 2018/0120371 A1 | 5/2018 | Biskeborn | |
| 2018/0120372 A1 | 5/2018 | Biskeborn | |

FOREIGN PATENT DOCUMENTS

| | | |
|---|---|---|
| JP | 2006060120 B2 | 3/2006 |
| JP | 2007004857 A | 1/2007 |

OTHER PUBLICATIONS

Coyne et al., "IBM Tape Library Guide for Open Systems," Redbooks, IBM.com/redbooks, Dec. 2018, pp. 1-556.

Martin, B., "STIC Search Report," Scientific and Technical Information Center, STIC Database Tracking No. 589145, EIC 2800, Mar. 13, 2019, 16 pgs.

Oliver et al., "Dielectric breakdown in magnetic tunnel junctions having an ultrathin barrier", Journal of Applied Physics, vol. 91, No. 7, Apr. 1, 2002, © 2002 American Institute of Physics, pp. 4348-4352.

List of IBM Patents or Patent Applications Treated as Related, Jun. 17, 2019, 2 pgs.

Biskeborn et al., "Diagnostics in TMR Sensors," U.S. Appl. No. 16/445,546, filed Jun. 19, 2019.

* cited by examiner

DIAGNOSTICS IN TMR SENSORS

BACKGROUND

The present invention relates generally to the field of magnetic tape readers, and more particularly to diagnosing and recovering from hardware failures in tunneling magnetoresistive sensors.

Tunneling magnetoresistive ("TMR") sensors are microelectronic devices that are characterized by a change in electrical resistance in the presence or absence of a magnetic field. Magnetic storage devices, such as magnetic tape drives and hard disk drives, rely upon TMR sensors to read data from magnetic media. Different regions of magnetic media correspond to bits of data, each of which can apply either of two different magnetic field states to the TMR sensor. The value of each bit, one or zero, can be determined electronically by measuring resistance across the TMR sensor such that one state may be characterized by a relatively high resistance and the other characterized by a relatively low resistance.

As with all microelectronic devices, TMR sensors experience hardware failures of various kinds. In particular, TMR sensors are often located at an air bearing surface, which exposes them to various kinds of external damage. Using software, for example controller firmware or driver software that operates a tape drive or magnetic disk drive, engineers can diagnose and mitigate various failures, thereby allowing devices to continue to function despite some operational defect at the microelectronic device level. Also with the aid of software, engineers can diagnose failures in devices that have been rendered inoperable or subjected to failure analysis.

SUMMARY

A computer-implemented method includes, by one or more processors in electronic communication with a tunneling magnetoresistive sensor, wherein the tunneling magnetoresistive sensor is a component of a magnetic storage drive configured to read magnetic data from a magnetic storage medium, detecting a short across the tunneling magnetoresistive sensor, measuring a change in resistance of the tunneling magnetoresistive sensor, measuring a change in voltage amplitude for the tunneling magnetoresistive sensor, and dividing said change in voltage amplitude by said change in resistance to yield a ratio. The computer-implemented method further includes, responsive to the ratio being greater than a predetermined ratio threshold, determining that the short is caused by a magnetic shunt. A corresponding computer program product and computer system are also disclosed.

In an aspect, the computer-implemented method further includes, responsive to the ratio being less than the predetermined ratio threshold, determining that the short is caused by at least one of a dielectric breakdown and a nonmagnetic shunt.

In an aspect, the computer-implemented method further includes, responsive to determining that the short is caused by the magnetic shunt, setting a bias voltage across the tunneling magnetoresistive sensor to a normal value, wherein the normal value is effective in the absence of the short.

In an aspect, the computer-implemented method further includes, responsive to determining that the short is caused by the dielectric breakdown, limiting a bias voltage across the tunneling magnetoresistive sensor to no greater than a voltage limit, wherein the voltage limit is a value effective for protecting the dielectric breakdown from growing.

In an aspect, another computer-implemented method includes, by one or more processors in electronic communication with a tunneling magnetoresistive sensor, responsive to detecting an operational anomaly in the tunneling magnetoresistive sensor, measuring a first resistance change in the presence of a positive bias current, measuring a second resistance change in the presence of a negative bias current. The computer-implemented method further includes, responsive to at least one of the first resistance change and the second resistance change being more positive than expected based on a device geometry for the tunneling magnetoresistive sensor, returning a probable determination that the operational anomaly is caused by a short across the tunneling magnetoresistive sensor. A corresponding computer program product and computer system are also disclosed.

In an aspect, another computer-implemented method includes, by one or more processors in electronic communication with a tunneling magnetoresistive sensor, wherein the tunneling magnetoresistive sensor is a component of a magnetic tape drive configured to read magnetic data from a magnetic tape, detecting a short across the tunneling magnetoresistive sensor contemporaneously with the tape running across the tunneling magnetoresistive sensor, and measuring a voltage amplitude across the tunneling magnetoresistive sensor as a function of a fractional current through the tunneling magnetoresistive sensor to yield a voltage amplitude data set. The computer-implemented method further includes, responsive to the voltage amplitude data set fitting a power law, wherein the power law comprises an exponent, and wherein the exponent is greater than an exponent threshold, determining that the short is caused by a magnetic shunt. A corresponding computer program product and computer system are also disclosed.

DETAILED DESCRIPTION

Figure 1:
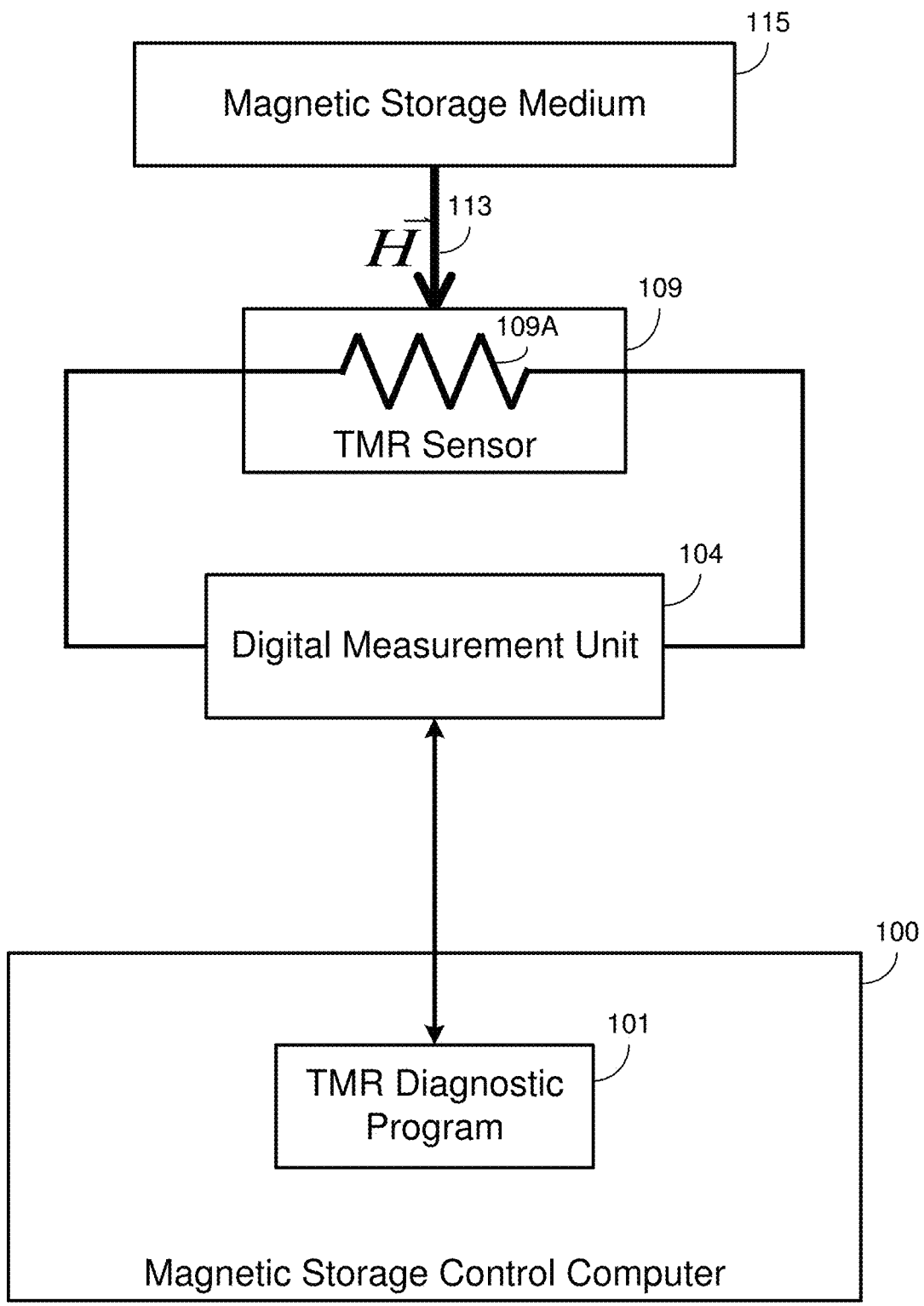
FIG. 1 is a functional block diagram illustrating an operational environment for a TMR diagnostic program, in accordance with at least one embodiment of the invention.

Referring now to the invention in more detail, FIG. 1 depicts an operational environment for a TMR diagnostic program 101, in accordance with at least one embodiment of the present invention. Broadly, the TMR diagnostic program 101 may be understood as a method to recover drive performance following shoring of a TMR sensor by distinguishing the shorting mechanism and setting the bias voltage accordingly. In the depicted embodiment, a magnetic storage control computer 100 is embedded in a magnetic tape drive. In alternative embodiments the magnetic storage control computer 100 may be embedded in a magnetic hard or floppy disk drive or any other magnetic storage medium for which TMR sensors may be applied as a reading device. In the depicted embodiment, the magnetic storage medium 115 (i.e., a tape, disk, or other magnetic data storage material) is proximate to a TMR sensor 109. In general, the TMR (a tunneling magnetoresistive sensor) may be understood as a component of a magnetic storage drive configured to read magnetic data from a magnetic storage medium.

More particularly, with respect to various embodiments, a TMR sensor is a multi-layer device which include three significant layers, among others: a pinned layer, a tunnel junction, and a free layer. The resistance of the TMR depends on the alignment of the magnetization of the pinned layer versus the free layer. When the magnetization of the pinned layer and free layer are aligned, the resistance is lowest. Correspondingly, when the pinned layer and free layer are anti-aligned, the resistance is highest. To fabricate a TMR with a reasonable resistance, the tunnel junction is very thin. For read heads configured to read from tape or hard disks, the tunnel junction thickness may be ~1 nm or lower. Because of the thin tunnel junction layer, shorts across the tunnel junction can occur, wherein current is shunted through the short rather than through the TMR layer.

The inventors have observed and/or recognized three different shorting mechanisms: (1) dielectric breakdown, wherein the dielectric material of the TMR sensor collapses in a narrow region (i.e., a pin-hole), as with an electric arc through air; (2) lapping scratches, wherein the lead material is bridged across the TMR sensor, and (3) tape scratches, which occur when running tape, and wherein the tape carries some form of particulate material across the TMR sensor, which results in a scratch across the read element, and, potentially, a conductive short across the thin tunneling barrier of the TMR sensor, in view of the high contact pressure of the tape across tape bearing surface. The inventors have observed and/or recognized that, in all three cases, if the voltage across the tunnel junction is maintained constant after the short has occurred, then the voltage amplitude of the TMR sensor in response from a magnetic field from the tape medial should revert to its value prior to the short. It should be noted that voltage amplitude may be understood as the peak-to-peak change in the resistance of the TMR sensor multiplied by the applied current to the TMR sensor. Thus, in the case of a conductive short in parallel with a TMR sensor, the voltage amplitude will be reduced, as described below. Thus, the inventors have observed and/or recognized, the TMR can still function after the short. However, the inventors have observed and/or recognized that a problem with the short from dielectric breakdown is that high levels of current passing through the small shorting pillar will likely cause the size of the pillar to grow, which in turn causes the shorting resistance to decrease without bound until the drive can no longer supply sufficient current to operate. The inventors have further observed and/or recognized that his problem is not present in shorts that occur due to lapping scratches or tape scratches.

Thus, the inventors have further observed and/or recognized that a means of distinguishing between the different sources of shorting can be employed to enable the continued use of TMR sensors that have shorted. The inventors have further observed and/or recognized that the previously known means of distinguishing between shorts due to dielectric breakdown and shorts due to lapping or tape scratches include only failure analysis. In failure analysis, a scratch is visible in an atomic force microscopy image of the air bearing surface in which the TMR sensor is embedded (e.g., FIGS. 8A-8B), similarly, under atomic force microscopy imaging, a TMR having experienced dielectric breakdown will not have a surface scratch. The inventors have further observed and/or recognized that there dielectric breakdown can occur at the tape bearing surface of the TMR, however such an event would be visible as a dot in an atomic force microscopy or scanning electron microscopy image, and the imaged shape would be visibly and diagnostically distinct from that of a scratch. In any event, failure analysis of TMR sensors requires the TMR sensor that has experienced a short to be taken out of service and physically brought to a laboratory setting where it can be examined with the aforementioned microscopy technologies and other imaging techniques. Thus, the inventors have further observed and/or recognized, a diagnostic method based solely on in situ electrical measurements of the TMR sensor would permit control software to keep the TMR sensor in service after detecting a short. It will be understood that the aforementioned problems solved by some embodiments of the invention and/or advantages over the prior art exhibited by some embodiments of the invention are not intended as limitations on the invention as claimed, and any particular advantage need not necessarily be present in all embodiments.

Referring still to FIG. 1, in the depicted embodiment, the magnetic storage medium 115 produces a magnetic field 113 (designated by the magnetic field strength symbol H). The magnetic field 113 changes in direction and/or magnitude with the data encoded upon that region of the magnetic storage medium 109 that is proximate to the TMR sensor 109. As the magnetic field 113 changes, the magnetization of the free layer in the TMR sensor 109 rotates, and the resistance of the TMR sensor 109 correspondingly changes. The TMR sensor 109 may be understood as a resistor 109A, the resistance of which may be measured via a digital measurement unit 104. The change in the TMR resistance with applied field times the bias current through the TMR sensor gives a voltage amplitude. It will be understood that FIG. 1 is a schematic representation only and that it is not the intent of the Applicant to suggest that the TMR sensor 109 literally contains a resistor 109A, but rather that the TMR sensor 109 has the property of a measurable resistance represented by a notional resistor 109A. The digital measurement 104 unit may be understood to include any circuit elements, sensors, logic gates, firmware, etc. that enable electrical measurements of the TMR sensor 109.

Referring still to the embodiment of FIG. 1, in addition to resistance, the digital measurement unit 104 may apply a bias current to the TMR sensor 109. The bias current may be in either direction across the TMR sensor 109 or it may alternate. The digital measurement unit 104 may measure the output voltage or voltage amplitude as a result of applying a defined bias current, which can include, selectively, direct current in either direction and alternating current over a range of frequencies. Similarly, the digital measurement unit 104 may measure resistance simultaneously with the application of a bias current so as to measure resistance as a function of changes in the bias current. Further, the digital measurement unit 104 may measure resistance repetitiously or continuously such that various effects can be observed as a function of changes in resistance.

Referring still to the embodiment of FIG. 1, the magnetic storage control computer 104 is in electronic digital communication with the digital measurement unit 104. For example, the digital measurement unit 104 may include one or more analog-digital converter circuits whereby the electrical properties of the TMR sensor 109 are made accessible as digital values to software operating on the magnetic storage control computer 100, such as the TMR diagnostic program 101. The TMR diagnostic program 101 may be understood as performing various electrical measurements of the TMR sensor 109 by accessing the digital measurement unit.

More generally, the electrical measurements of the TMR sensor 109 may be understood in terms of several relationships, which the inventors have identified. For a tunnel junction with a resistance $R_{mro}$ and a parallel short with a resistance $R_s$, current is diverted through $R_s$, and overall resistance R for the tunnel junction is:

$$R = R_{mro} \cdot \frac{R_s}{(R_s + R_{mro})} \qquad \text{Equation 1}$$

The change in resistance $\Delta R_{TMR}$ for the same tunnel junction is:

$$\Delta R_{TMR} = 100\% \cdot \frac{(R - R_{mro})}{R_{mro}} = -100\% \cdot \frac{R_{mro}}{(R_s + R_{mro})} \qquad \text{Equation 2}$$

For a constant current of $I_{mro}$ applied to the TMR sensor, the current through the tunnel junction, $I_{mr}$, is decreased by the ratio, $$\frac{R}{R_{mro}}:$$

$$I_{mr} = \frac{V}{R_{mro}} = I_{mro} \cdot \frac{R}{R_{mro}} = I_{mro} \cdot \frac{R_s}{(R_s + R_{mro})}$$

Equation 3

When a magnetic field of strength $H_f$ is applied to a TMR sensor, the change in resistance, $\Delta R_{TMRH}$, is proportional to $H_f$ and is a fraction $F_{TMR}$ of the resistance of the TMR sensor:

$$\Delta R_{TMRH} = F_{TMR} \cdot H_f \cdot R_{mro} \qquad \text{Equation 4}$$

The voltage amplitude Amp is the current times the resistance change, $Amp_o$ is the voltage amplitude at a current of $I_{mro}$ prior to the short:

$$Amp = I_{mr} \cdot F_{TMR} \cdot H_f \cdot R_{mro} =$$
$$I_{mro} \cdot F_{TMR} \cdot H_f \cdot R_{mro} \cdot \frac{R}{R_{mro}} = Amp_o \cdot \frac{R}{R_{mro}}$$
Equation 5

Thus, under constant current, the change in voltage amplitude ΔAmp is:

$$\Delta Amp = 100\% \frac{(Amp - Amp_o)}{Amp_o} = \Delta R$$
Equation 6

Thus, the change in amplitude, expressed as a percentage (or, as a ratio, if the factor of 100% is removed), if equal to the change in resistance, also expressed as a percentage (or, as a ratio, if the factor of 100% is removed), and thus:

$$\frac{\Delta Amp}{\Delta R} = 1$$
Equation 7

Figure 5A:
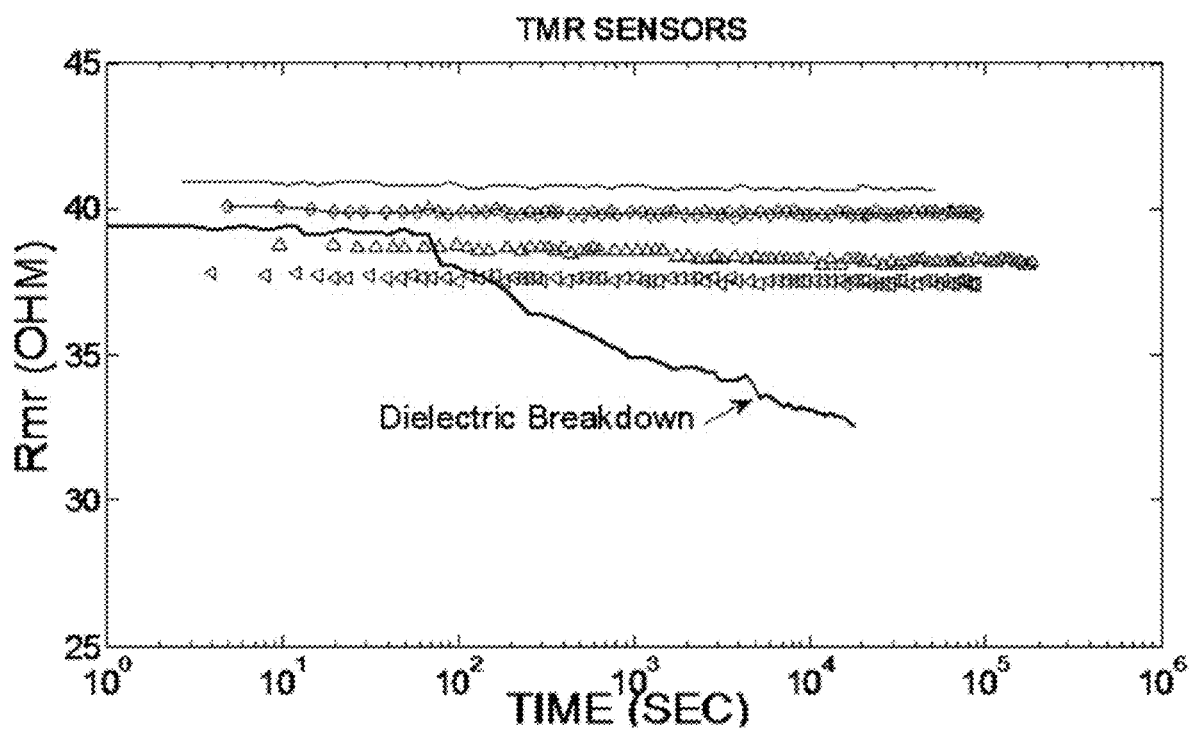
FIG. 5A is a plot of resistance versus time in an experiment demonstrating resistance drop in a TMR sensor that has experienced dielectric breakdown as compared with several that have not.

Equation 7 provides a theoretical prediction for the ratio of the change in voltage amplitude to the change in resistance, however the inventors have observed, by experiment, that the theoretical value is not realized in practice. FIG. 5A is a plot of TMR resistance versus time for five TMR sensors, one of which has suffered dielectric breakdown during a constant voltage stress experiment. FIG. 5A shows how the short continues to grow for the TMR sensor which has experienced dielectric breakdown, as evidenced by the change in resistance continuing to drop over time. The inventors have further observed and/or recognized that, if the voltage stress on the TMR sensor with a dielectric breakdown is decreased sufficiently, then the short will stop growing and the amplitude will remain stable.

Figure 5B:
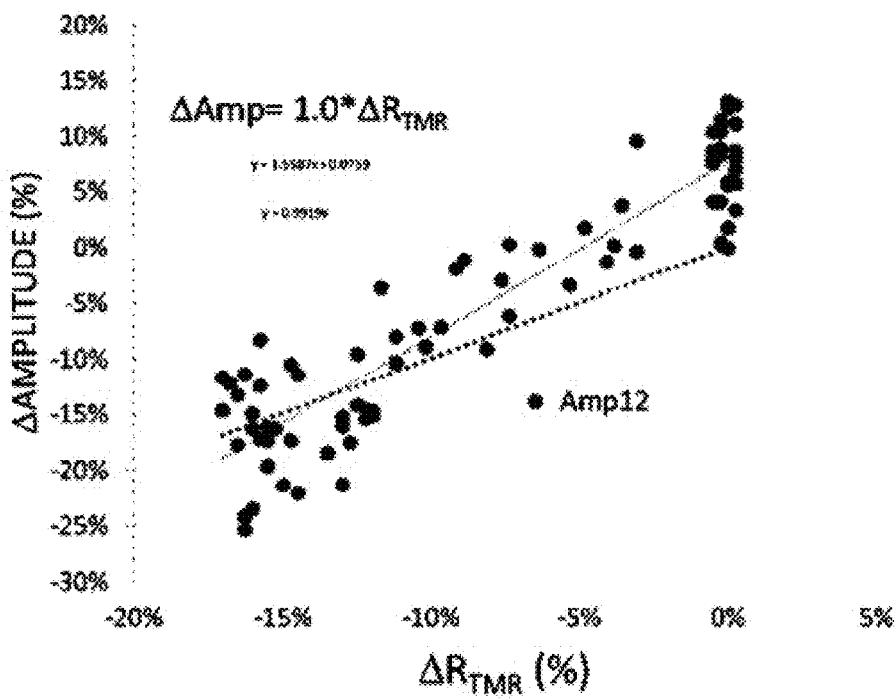
FIG. 5B is a plot of change in voltage amplitude versus change in resistance for a TMR sensor that has experienced dielectric breakdown through a pin-hole.

FIG. 5B is a plot of ΔAmp versus $\Delta R_{TMR}$ with the predicted line of Equation 7. The cluster of low values on the left shows how, after dielectric breakdown occurs, if the voltage remains high across the shorted TMR sensor, then the size of the shorting pillar grows and the amplitude continues to drop. This leads to failure of the TMR sensor. In FIG. 5B, the dotted line shows the ideal Equation 7, with a slope of 1, and is the value determined when fitting the data when forcing $$\frac{\Delta R}{\Delta Amp} = 0$$

at R=0. The lighter line shows a linear regression of the data points with a slope of 1.56.

Figure 6A:
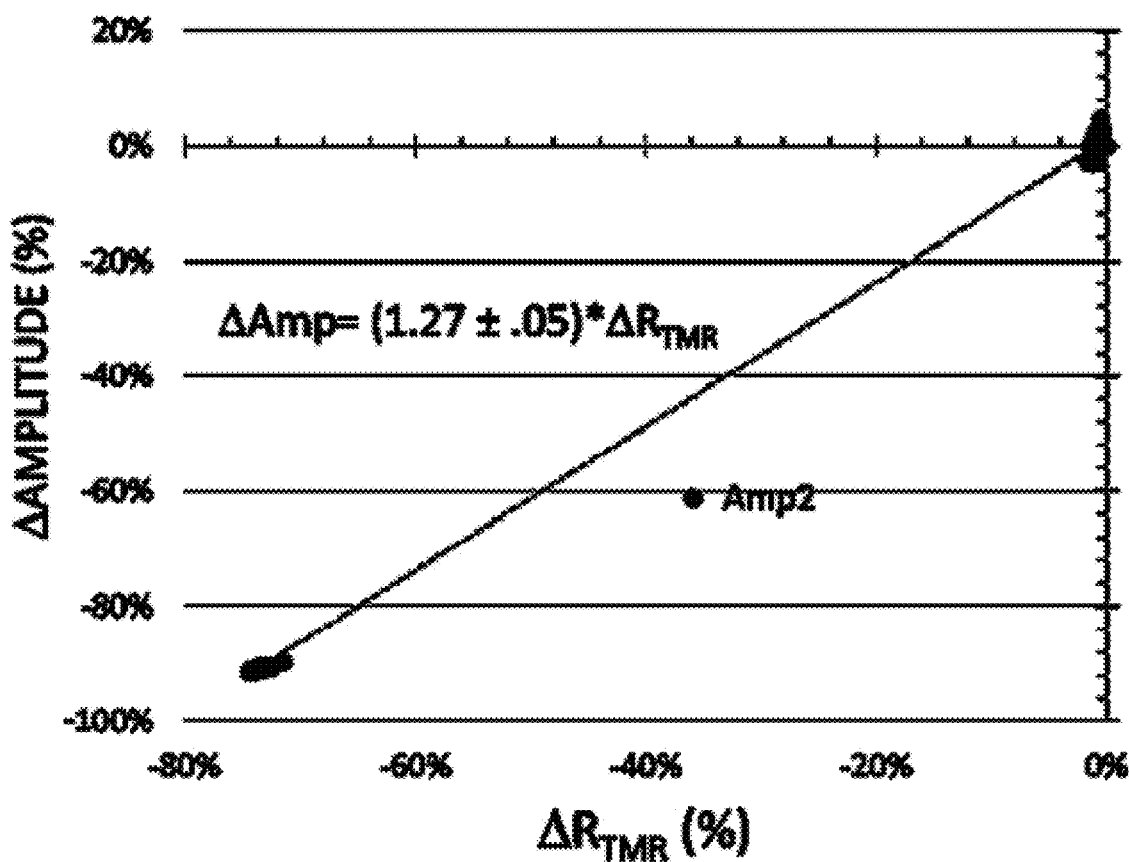
FIG. 6A is a plot of the change in voltage amplitude at a constant current versus change in resistance for TMR sensors with shorts due to dielectric breakdown, wherein a first group of TMR sensors experienced dielectric breakdown from Electrical Over Stress (EOS) pulses.
Figure 6B:
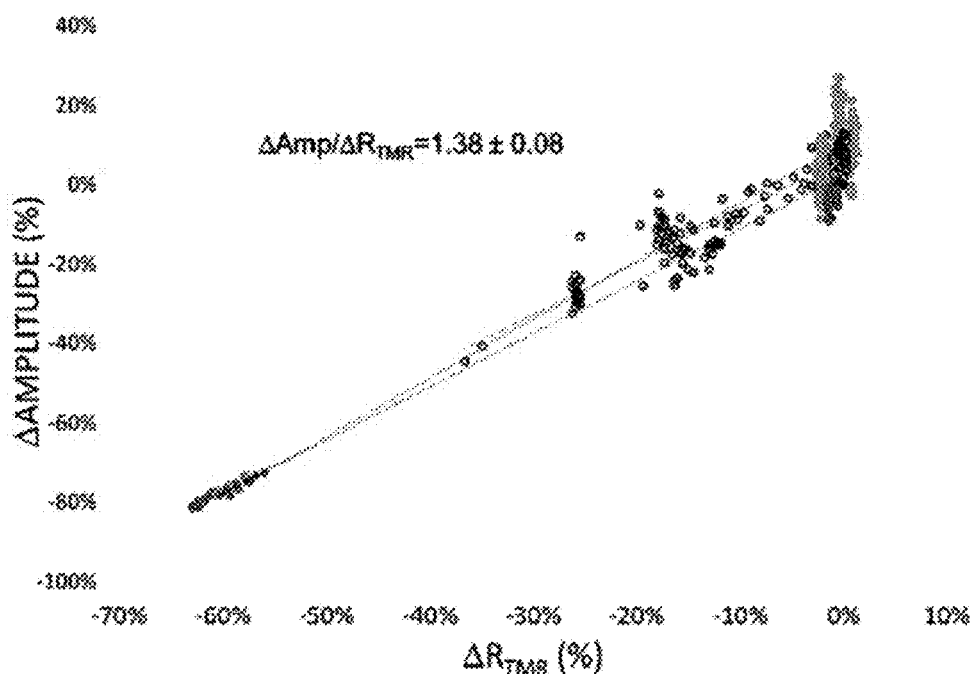
FIG. 6B is a plot of the change in voltage amplitude at a constant current versus change in resistance for TMR sensors with shorts due to dielectric breakdown, wherein a second group of TMR sensors experienced dielectric breakdown from EOS pulses.

FIG. 6A is a plot of the change in voltage amplitude at a constant current versus change in resistance for TMR sensors with shorts due to dielectric breakdown for group of 20 TMR sensors that experienced dielectric breakdown from EOS pulses over a short time (~25 ns-100 ns). The slope (i.e., average) of $\Delta Amp/\Delta R_{TMR}$ was 1.27±0.05. FIG. 6B is a similar plot for three TMRs that experienced dielectric breakdown from EOS over a long time (~10 s-days). The slope of $\Delta Amp/\Delta R_{TMR}$ was 1.38±0.08. These results are 27% and 38% higher, for FIGS. 6A and 6B, respectively, than for the ideal case of Equation 7. The inventors hypothesize that the higher slopes are explained by and/or due to the loss in area in the TMR due to the short.

Figure 7:
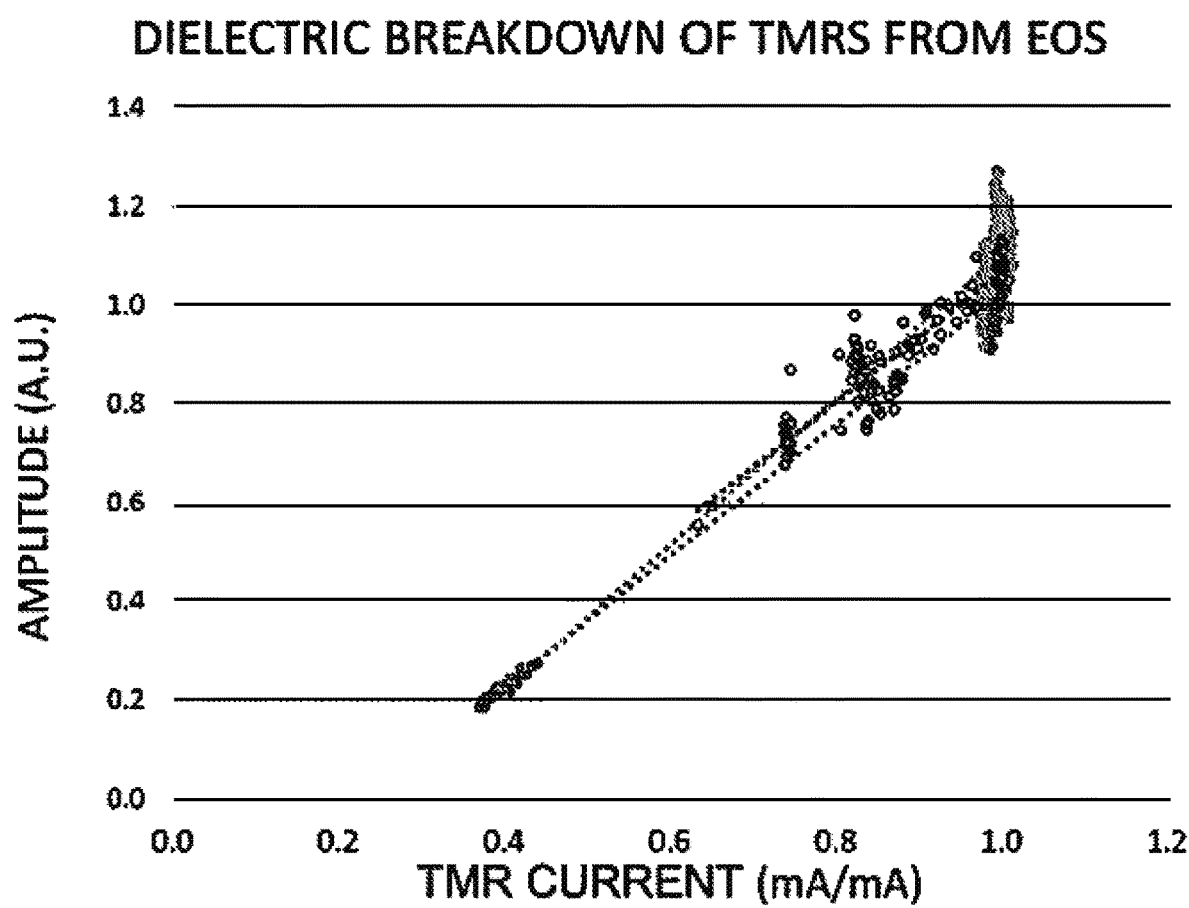
FIG. 7 is a plot of voltage amplitude versus fractional current for TMR sensors that have experienced dielectric breakdown from EOS pulses.

FIG. 7 is a plot of amplitude versus fractional current through the same TMR sensors whose measurements are presented in FIG. 6B. For the ideal case of a shorting resistor in parallel with the TMR sensor, the slope of Amplitude (Amp) versus current through the TMR (ITMR) is expected to be linear with a slope of unity (as in Equation 7). Data for all three shorted TMR sensors was fit with a linear equation with a slope of 1.38±0.09%/% and a zero intercept of −0.28±0.09%/%, as shown.

In all of the cases studied by the inventors, the dielectric breakdown shorts generated by EOS pulses resulted in amplitude drops which are similar to, but higher than expected from an ideal parallel short model. The amplitude versus the effective current through the shorted TMR sensor can be fit with a linear equation with a slope of between about 1 to 1.6%/%. The change in amplitude versus change in resistance can be fit with a slope of 1.3%/% within a range of +0.3%/%.

Figure 8A:
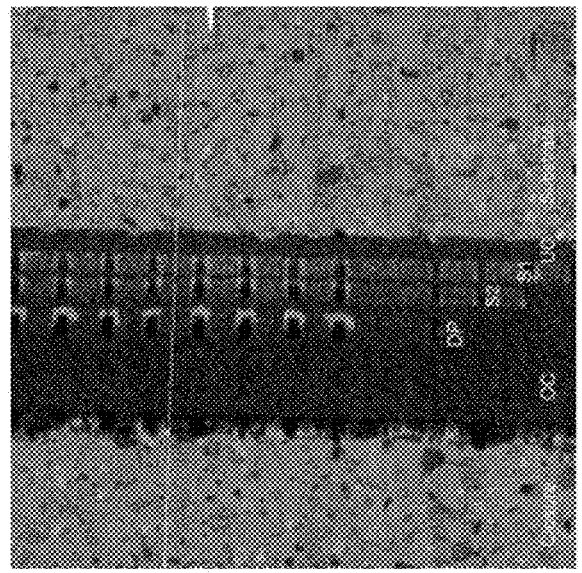
FIG. 8A is an atomic force microscopy image at 25 µm of a tape reader that has experienced a lapping scratch.
Figure 8B:
FIG. 8B is an atomic force microscopy image at 5 µm of a tape reader that has experienced a lapping scratch.
Figure 8C:
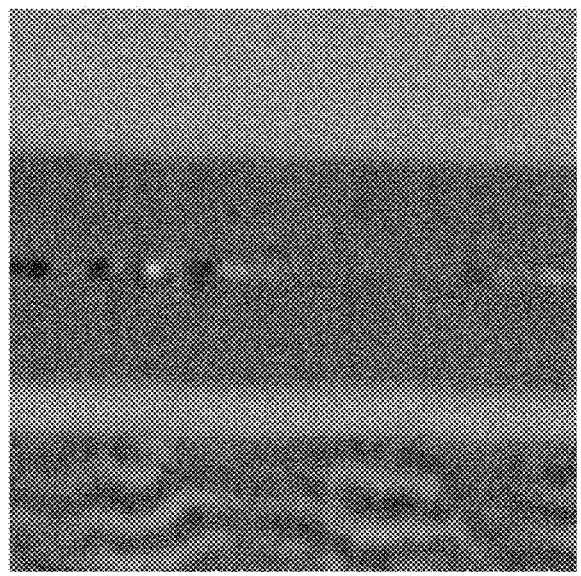
FIG. 8C is a magnetic force microscopy image at 5 µm of a tape reader that has experienced a lapping scratch.

In addition to dielectric breakdown, lapping and tape scratches are also a cause of shorts in TMR sensors. FIG. 8A is an atomic force microscopy image at 25 μm of a tape reader that has experienced periodic scratches from a particle on the tape. The spacing between the scratches is the physical distance the tape is stepped over between wraps of the tape (also known in the art as "track pitch"). FIG. 8B is an atomic force microscopy image at 5 μm of the same tape reader. FIG. 8C is a magnetic force microscopy image at 5 μm of the same tape reader. In the experiment shown, the scratches were 15.8 nm deep, 2.02 μm spacing between, and 0.57 μm wide. As shown, the scratch features demonstrate how a particulate embedded in the tape can be dragged across the TMR sensor at the air bearing surface, causing a short.

Figure 9A:
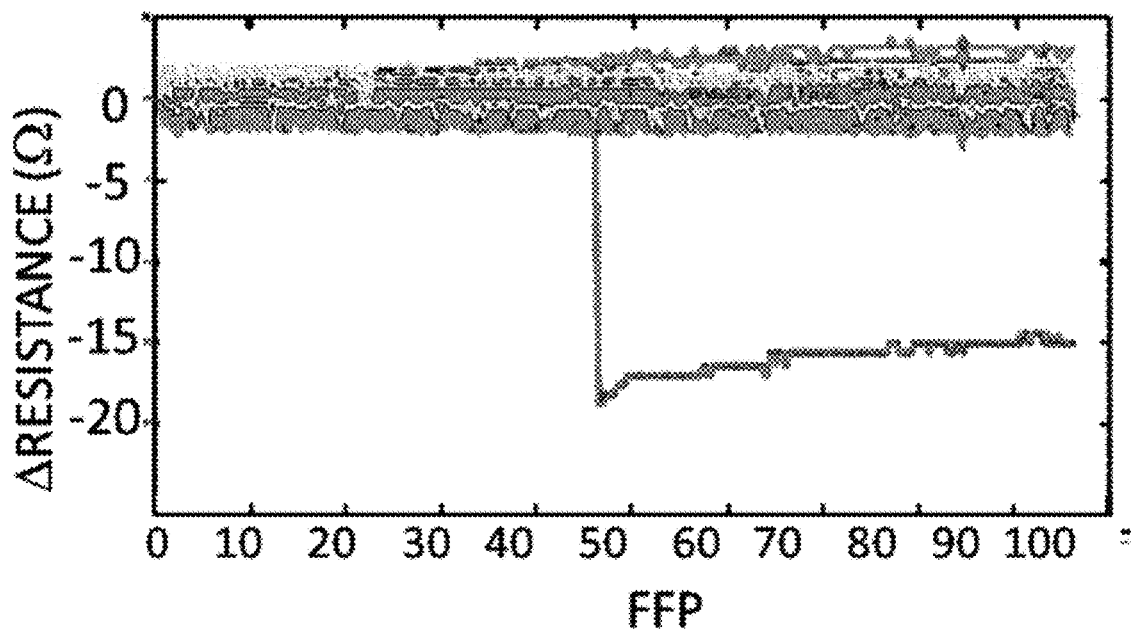
FIG. 9A is a plot of resistance versus time for a group of TMR sensors, one of which has experienced a lapping scratch.
Figure 9B:
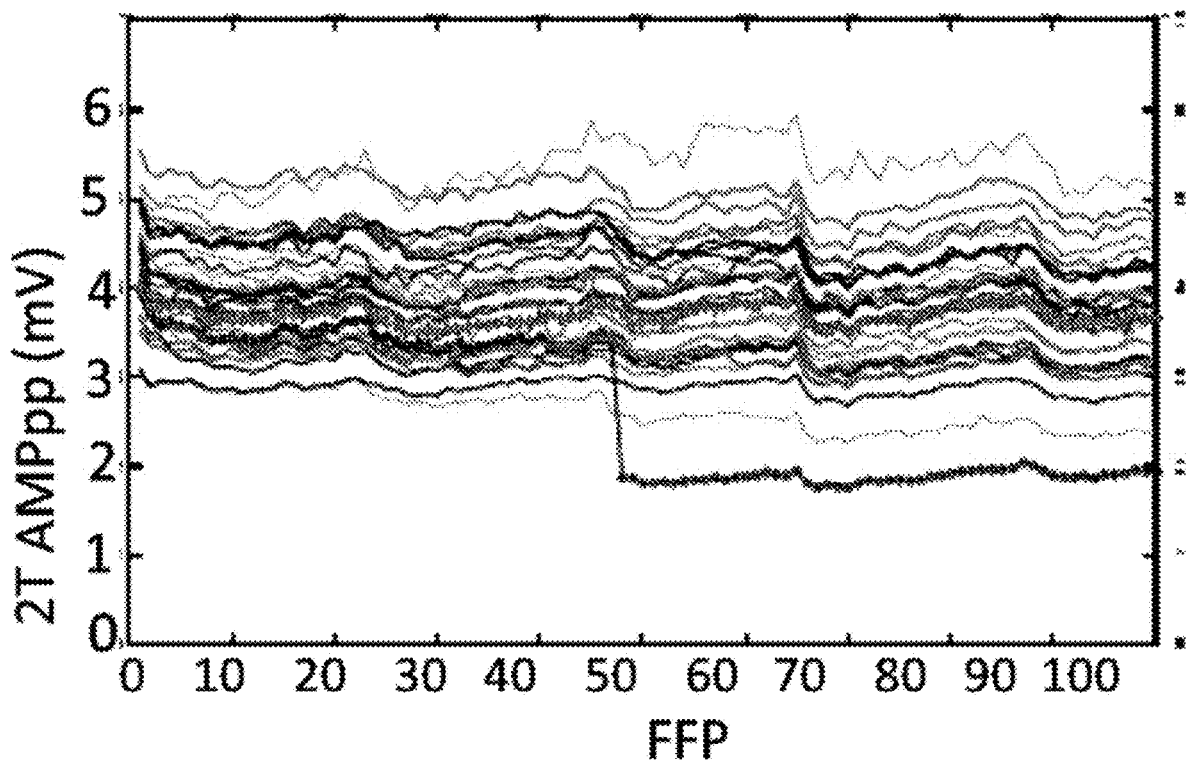
FIG. 9B is a plot of voltage amplitude versus time for a group of TMR sensors, one of which has experienced a lapping scratch.

FIG. 9A is a plot of resistance versus time for a group of TMR sensors, one of which suffered a short due to a particulate on the tape scratching the surface of the TMR sensor and dragging metal material across the tunnel junction, causing a short in parallel with the bulk of the TMR. FIG. 9B is a plot of the 2T-Amplitude from a read-back signal from magnetic transitions written on the tape. 2T is a fundamental period of data density for a given tape. The resistance dropped by −15% while the Amplitude dropped by 43%, or a ratio of $$\frac{\Delta Amp}{\Delta R_{TMR}}$$

of 2.9. Two important observations are: (1) The ratio of $$\frac{\Delta Amp}{\Delta R_{TMR}}$$

of 2.9 is almost 3 times the expected value for a simple parallel short, and (2) the resistance did not continue to drop in this case, so the voltage can be increased to yield higher output.

Figure 10A:
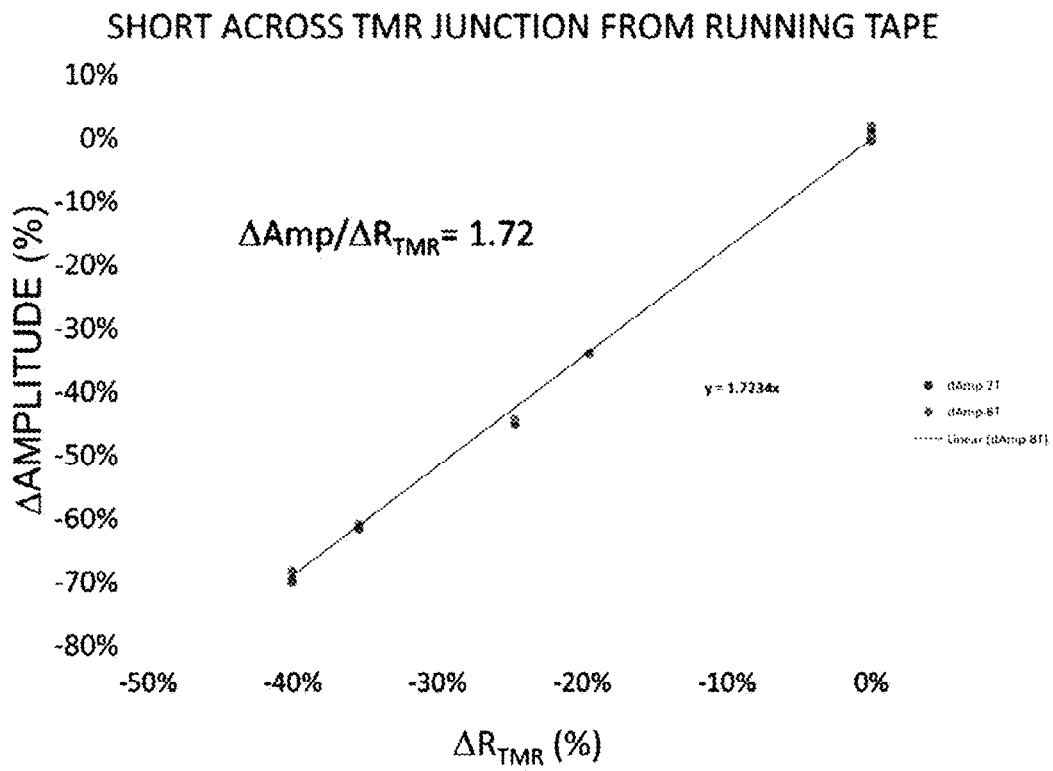
FIG. 10A is a plot of change in voltage amplitude at constant current versus change in resistance due to a short occurring while running against tape for $-40\% < \Delta R < 0$.
Figure 10B:
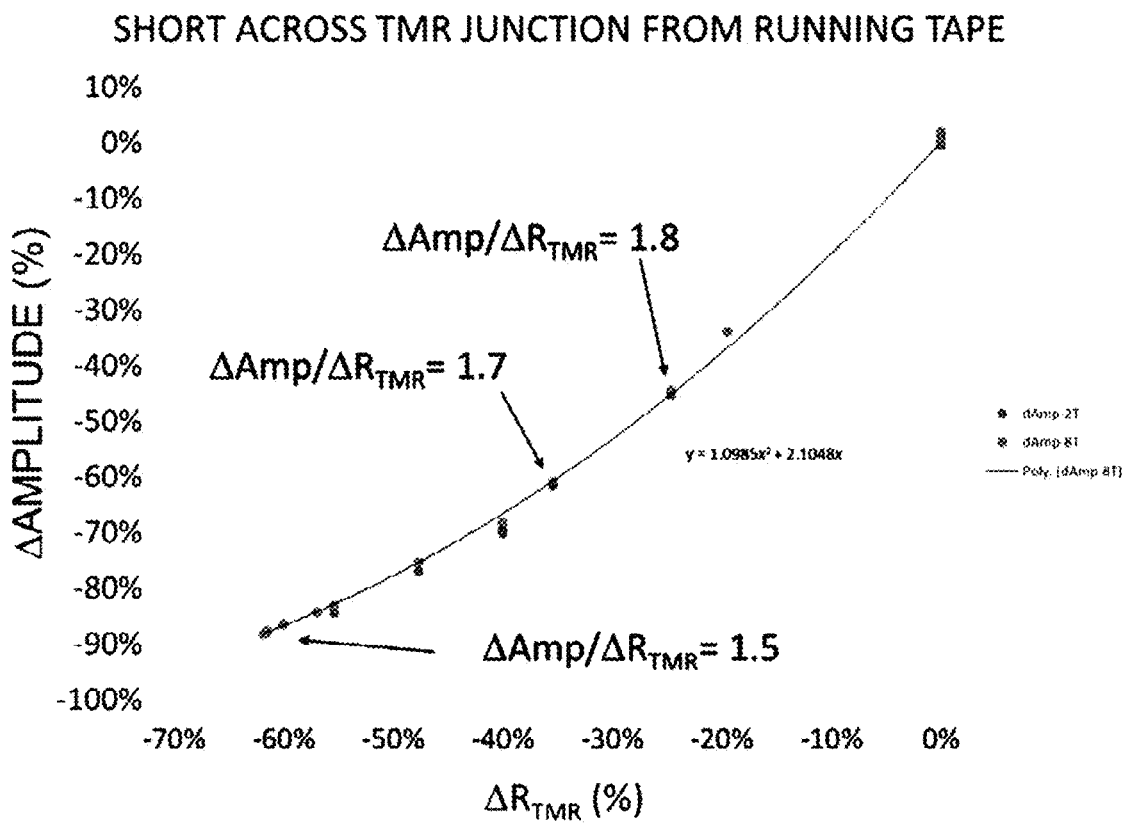
FIG. 10B is a plot of change in voltage amplitude at constant current versus change in resistance due to a short occurring while running against tape for $-60\% < \Delta R < 0$.

FIGS. 10A and 10B are a plots of the change in voltage amplitude at a constant current versus change in resistance for TMR sensors with shorts due to scratches across the tunnel junction from tape wear. For FIG. 10A, the relevant range is −40%<ΔR<0. For FIG. 10B, the relevant range is −60%<ΔR<0%. The observed change in resistance due to the short was between −10% and −25%. The inventors concluded that the reason for the range in $\Delta R_{TMR}$ is because the TMR studied suffered multiple scratches, with the resistance dropping with each additional scratch. The inventors observe that the slope, $$\frac{\Delta Amp}{\Delta R_{TMR}},$$

is 1.74 for these parts, is significantly higher than the predicted value of 1 for a simple parallel short, and larger than the values measured from dielectric breakdown. The inventors further observe that the results are essentially identical for 2T and 8T amplitudes, and thus they conclude that the additional amplitude drop is not due to Wallace spacing losses. Further, for ΔR>−40% (i.e., for Amplitude losses of less than 40%), the drop in voltage amplitude with change in resistance is higher than calculated from a simple parallel resistance shunt, and for ΔR<−40%, (i.e., for Amplitude losses of greater than 40%), the slope in $$\frac{\Delta Amp}{\Delta R}$$

decreases.

Figure 11A:
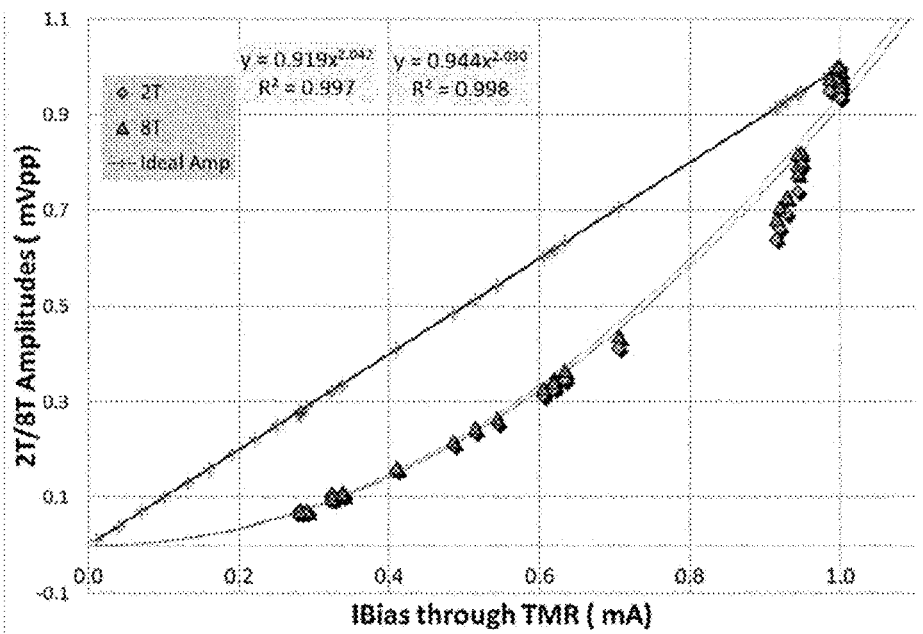
FIG. 11A is a plot of fractional current in a first TMR sensor when a short occurs while tape is running.
Figure 11B:
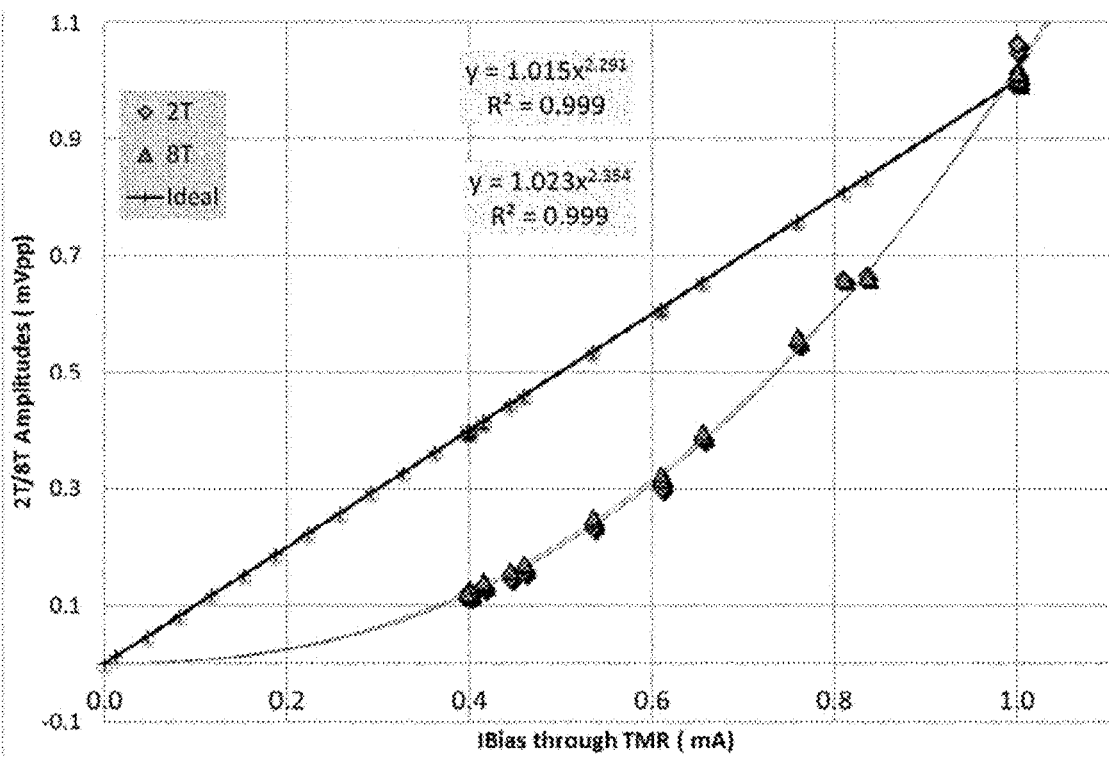
FIG. 11B is a plot of fractional current in a second TMR sensor when a short occurs while tape is running.

FIGS. 11A and 11B are plots of normalized 2T and 8T amplitudes versus fractional current through the shorted TMR sensor, where the shorts are due to scratches on tape, as in FIG. 10. The data is fit to a power law, with an exponent β of 2.0 and 2.3:

$$I_{TMR} = I_0 \frac{R}{R_{TMR_0}} \quad \text{Equation 8}$$

$$Amp_{Norm} = \left(\frac{I_{TMR}}{I_0}\right)^\beta = I_{TMR_{Norm}}^\beta \quad \text{Equation 9}$$

In Equations 8 and 9 above, R is the resistance with the short, $R_{TMR}$ is the initial resistance of the TMR sensor, $Amp_{Norm}$ is the amplitude normalized to the TMR's pre-short value, $I_0$ is the bias current applied to the sensor in measuring the amplitude, and ITMR is the current flowing through the TMR sensor in the presence of the short. $ITMR_{Norm}$ is the current through the TMR sensor normalized to $I_0$. In the ideal case, β is 1.0.

The slope of $Amp_{Norm}$ versus $ITMR_{Norm}$ varies with $ITMR_{Norm}$:

$$\frac{\Delta Amp_{Norm}}{\Delta TMR_{Norm}} = \beta \cdot I^{\beta-1} \quad \text{Equation 10}$$

The slope is maximum at $ITMR_{Norm}=1$, and equal to 1. For the parts studied by the inventors, the slope is between 2 and 3 for $ITMR_{Norm}$ greater than about 0.8, whereas the slope is 1 for the ideal model of a shorting resistor.

Figure 12A:
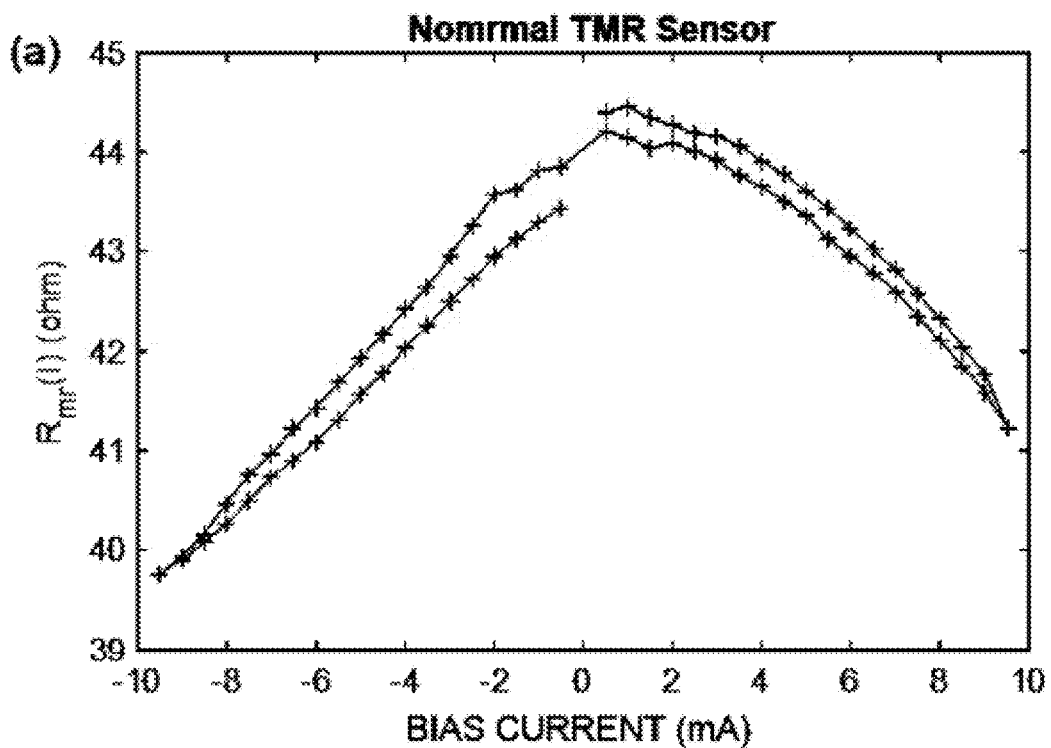
FIG. 12A is a plot of resistance versus bias current for a TMR sensor prior to a short.
Figure 12B:
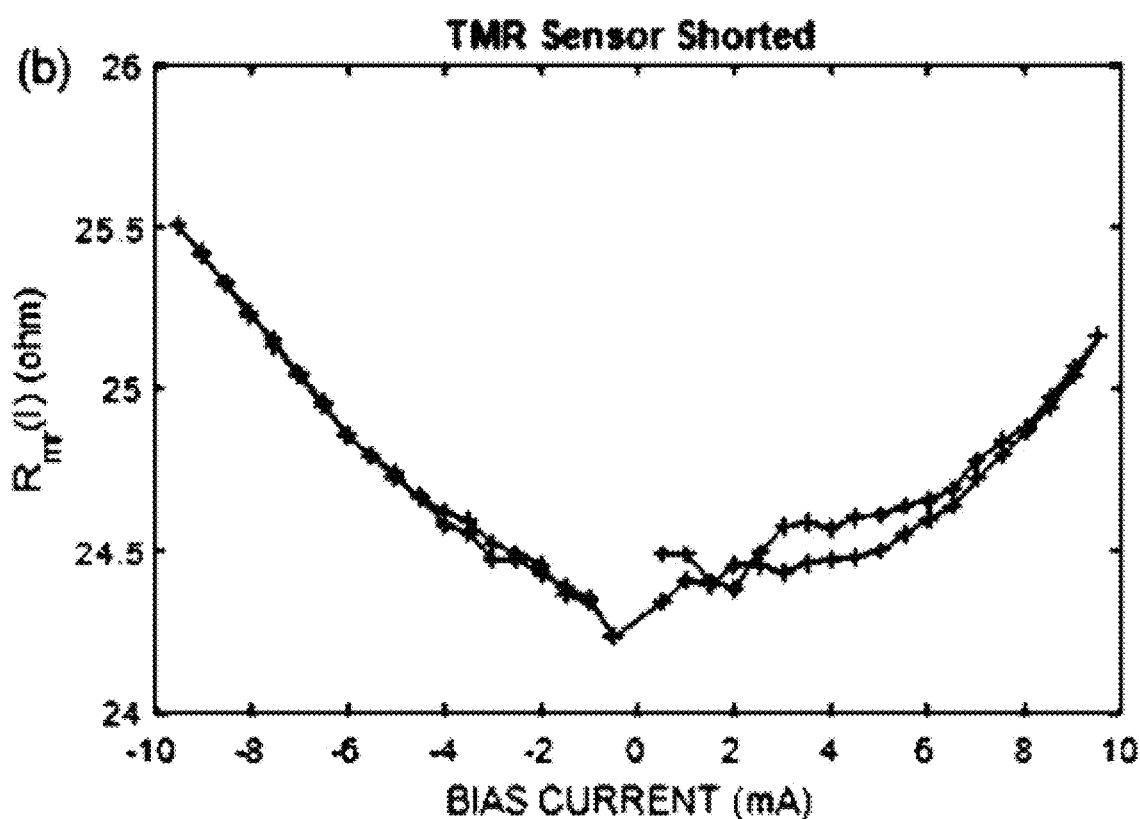
FIG. 12B is a plot of resistance versus bias current for a TMR sensor after a short.

FIG. 12A is a plot of resistance versus bias current for a TMR sensor prior to a short. As shown, the resistance decreases with bias current for both positive and negative polarity, which is the expected behavior for a TMR device, and TMR sensors without a short have been observed to decrease resistance with increasing voltage across the TMR sensor. Resistance is therefore expected to decrease monotonically for at least one polarity. FIG. 12B shows resistance increasing after a short for both polarities. The increase in resistance is understood by the inventors to be due to joule heating because of the principle that the resistance of a metal increases with its temperature. Therefore, the increase in resistance indicates that a thin short brides across the tunnel junction and is heating up due to the large current density through the short. While the resistance of a tunnel junction will decrease with increasing voltage across it, the resistance of a metal will increase. The inventors have observed and/or recognized that this technique of determining a short may be applicable if the history of a given TMR is not known (e.g., if it is installed in a newly manufactured and unused read head), and therefore it is not possible to take a difference between a current and a previously measured resistance value. The inventors have further observed and/or recognized that the aforementioned method may also be applicable in distinguishing between a drop in resistance due to a magnetically induced change and a physical short. If a short is detected by a drop in measured resistance, but the change in resistance versus bias current is normal, then it is likely a magnetically induced change in the sensor and not physically induced short such as a scratch or dielectric breakdown.

Figure 13:
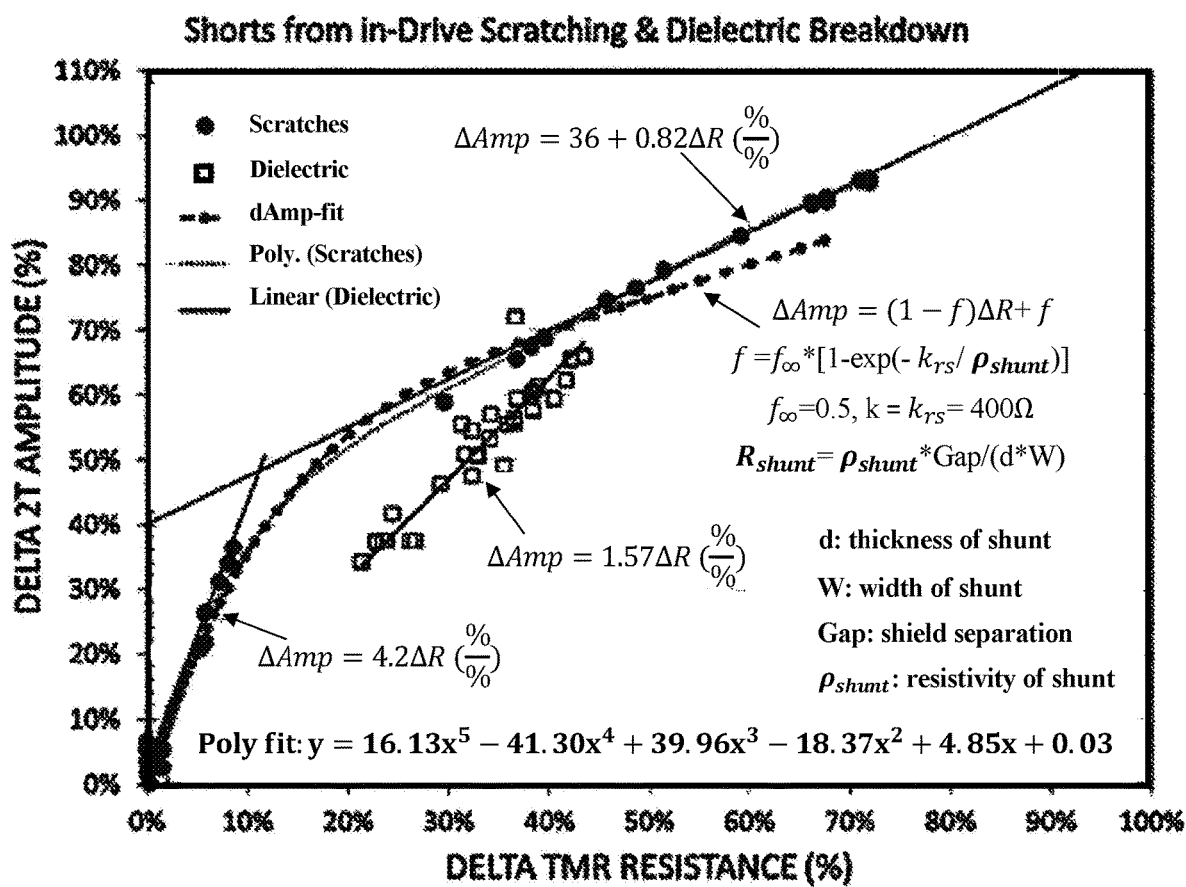
FIG. 13 is a plot of change in amplitude versus change in resistance across the TMR sensor for a first group with shorts due to lapping scratches and a second group with shorts due to dielectric breakdown.

FIG. 13 compares the properties of shorts from drive scratching with those from dielectric breakdown. FIG. 13 is a plot of change in voltage amplitude versus change in TMR resistance for a first group of TMR sensors with shorts that occurred in a drive due to scratches and a second group of TMR sensors that intentionally experienced dielectric breakdown. As shown, dielectric breakdowns, denoted by the white squares, are shown to have a linear profile over a range of tested ΔR, while the scratches, denoted as black dots, have a nonlinear profile in accordance with the above-described equations. The white squares are short from the drive of FIGS. 9A and 9B. Also shown is a fit to shorts due to scratches using the concept of shielding at the ABS due to magnetic material in the shunt, as discussed below. The dotted line fits the change in amplitude versus resistance for a resistive shunt combined with a magnetic shunt.

Figure 14A:
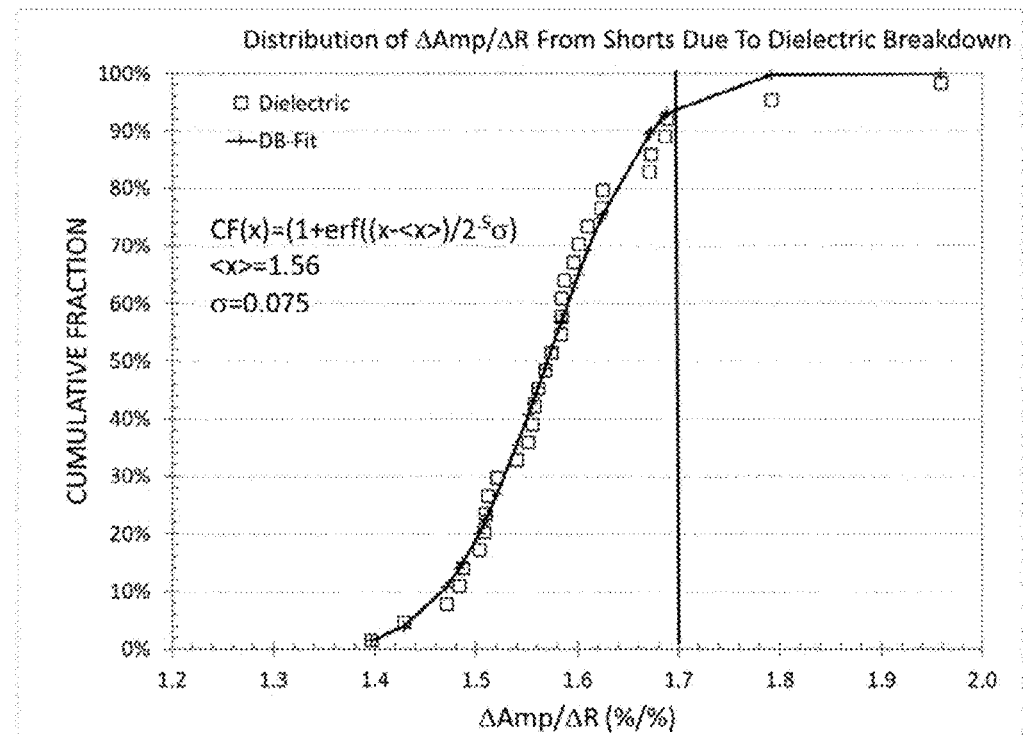
FIG. 14A is plot of a distribution of $\Delta Amp/\Delta R$ from shorts due to dielectric breakdown with $\Delta R \leq 50\%$.
Figure 14B:
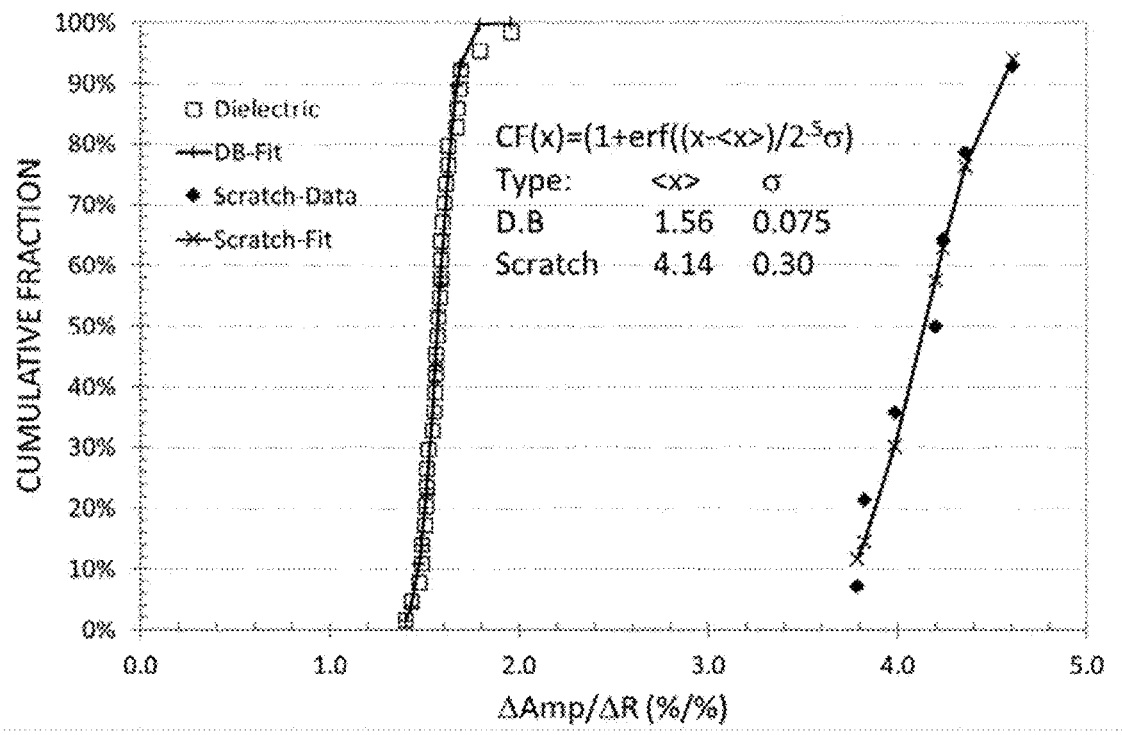
FIG. 14B is plot of a distribution of $\Delta Amp/\Delta R$ from shorts due to dielectric breakdown with $\Delta R \leq 50\%$ and from lapping scratches with $\Delta R \leq 20\%$.
Figure 14C:
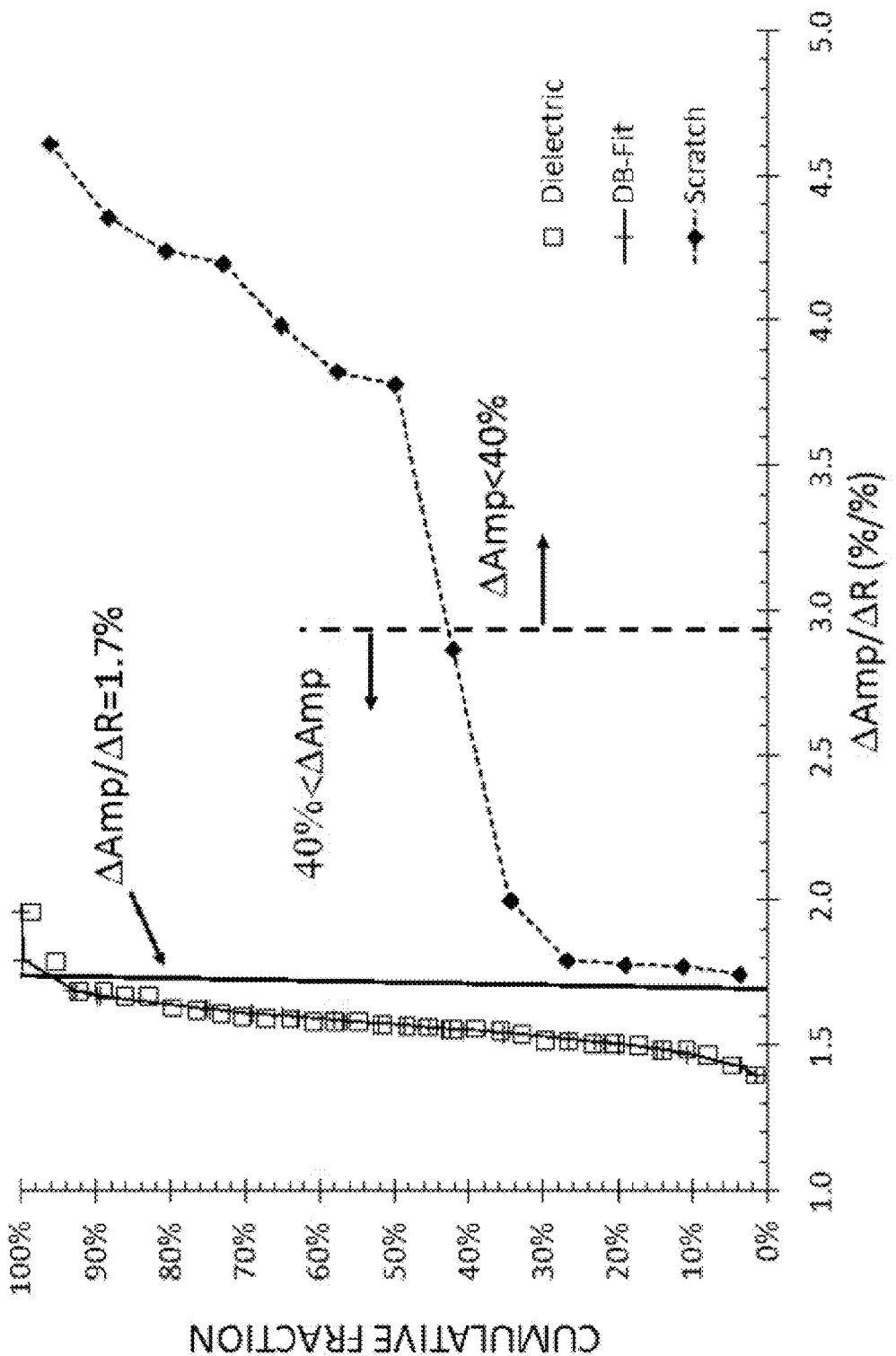
FIG. 14C is plot of a distribution of $\Delta Amp/\Delta R$ from shorts due to dielectric breakdown with $\Delta R \leq 50\%$ and from lapping scratches with $\Delta R \leq 65\%$.

FIGS. 14A, 14B, and 14C demonstrate the diagnostic value of the $$\frac{\Delta Amp}{\Delta R}$$

ratio. FIG. 14A shows the distribution of $$\frac{\Delta Amp}{\Delta R}$$

from shorts due to dielectric breakdown taken from FIG. 13. FIG. 14B introduces $$\frac{\Delta Amp}{\Delta R}$$

for scratches, which is generally and diagnostically greater than for dielectric breakdown, where the data is from FIG. 13 for parts with ΔR<10%. FIG. 14C shows the distribution of $$\frac{\Delta Amp}{\Delta R}$$

from shorts due to dielectric breakdown and from Scratches with ΔAmp≤65%, where the data is again taken from the data in FIG. 13. 93% of the parts with dielectric breakdown have a $$\frac{\Delta Amp}{\Delta R} < 1.7,$$

and 100% of the scratches had a $$\frac{\Delta Amp}{\Delta R} > 1.7.$$

Thus the value of $$\frac{\Delta Amp}{\Delta R}$$

is diagnostic for determining whether a short is from a scratch or dielectric breakdown.

Figure 15A:
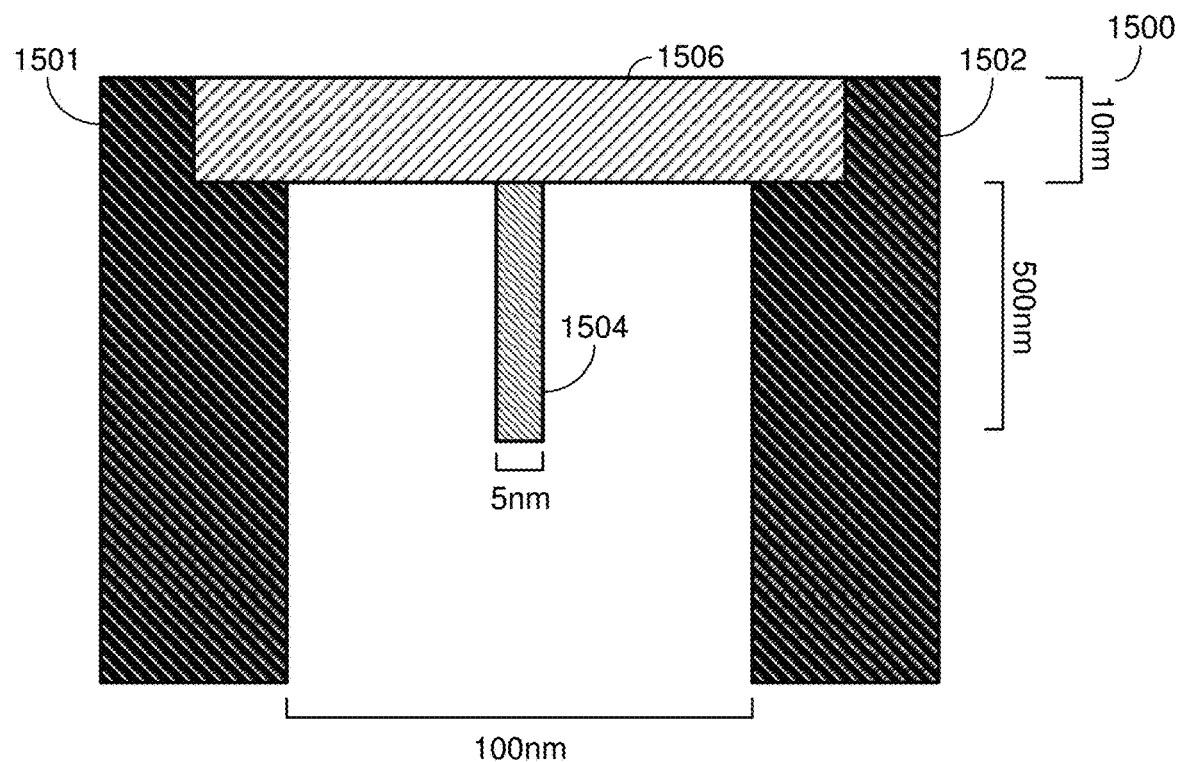
FIG. 15A is a side profile view schematic depiction of a TMR sensor as considered in magnetic modeling with respect to at least one embodiment of the invention.
Figure 15B:
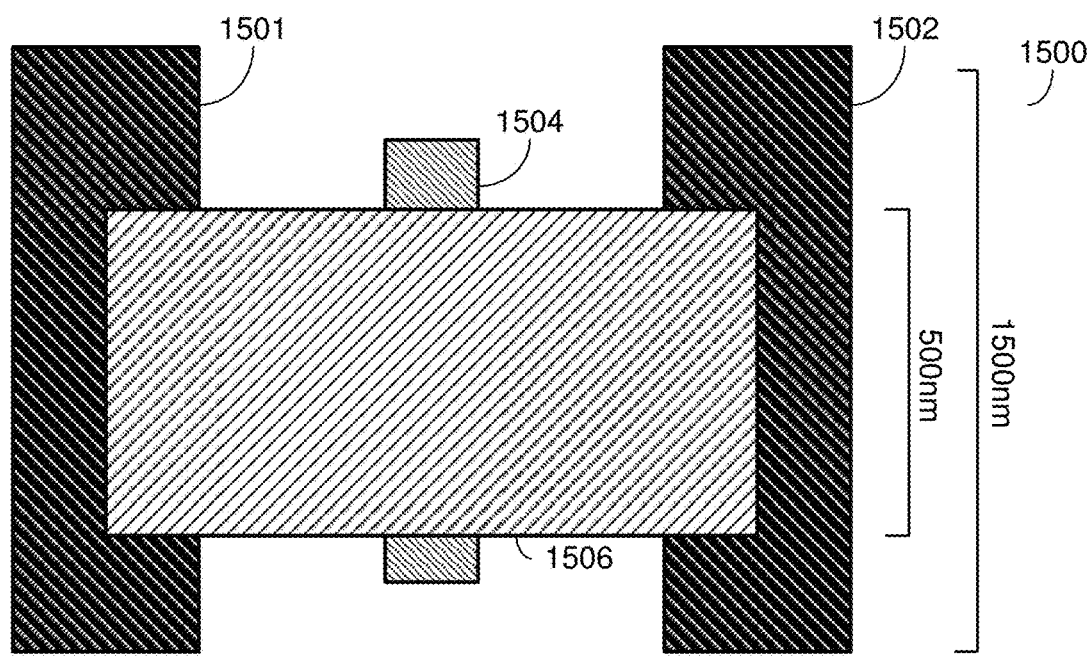
FIG. 15B is a plan view schematic depiction of a TMR sensor as considered in magnetic modeling, with respect to at least one embodiment of the present invention.
Figure 16A:
FIG. 16A is a schematic depiction of a model for magnetic shielding of a shunt.
Figure 16B:
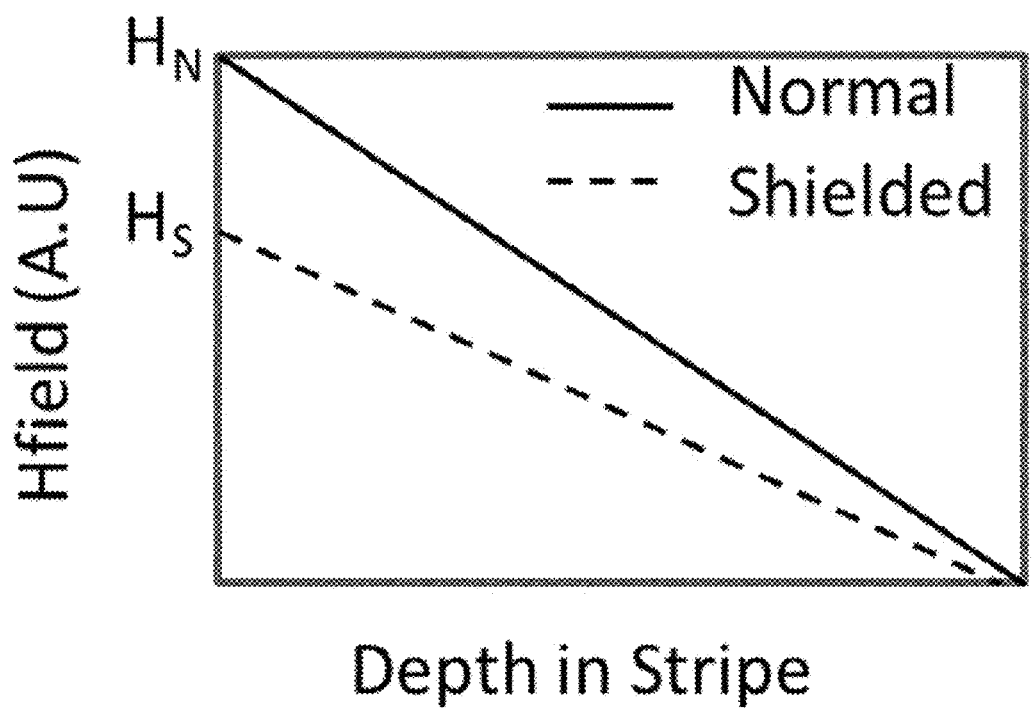
FIG. 16B is a theoretical plot of magnetic field strength versos material depth for shielded and normal shunts.

The inventors have further studied a magnetic model related to the present invention. FIGS. 15A and 15B show the geometry of the modeled tape reader 1500. FIG. 15A is a side profile view of the modeled TMR sensor. FIG. 15B is a plan view of the same device. Conductive shields 1501 and 1502 are opposed across a gap, which is bridged by a shunt 1506. This attempts to model a tape scratch and/or lapping scratch wherein conductive material is dragged across the reader layers. The free layer 1504 sits in between the shields and provides its properties into the model. FIG. 16A models the shields 1501 and 1502 as Ro and $R_s$. FIG. 16B describes the expected H field behavior for a shielded and unshielded reader. The shield effects in the depicted model are as follows:

$$R = \frac{R_0 \cdot R_s}{(R_s + R_0)} \quad \text{Equation 11}$$

$$\Delta R = \frac{(R - R_0)}{R_0} = -\frac{R_0}{R_s + R_0} \quad \text{Equation 12}$$

$$I_{mr} = \frac{V}{R_0} = I_{b0} \cdot \frac{R}{R_0} \quad \text{Equation 13}$$

$$\text{Signal: } \Delta R_{amp} = A_s \cdot R_0 \cdot \frac{H_F}{2} \quad \text{Equation 14}$$

$$Amp = I_{mr} \cdot \Delta R_{amp} = \quad \text{Equation 15}$$
$$I_{mr} \cdot A_s \cdot R_0 = I_{b0} \cdot \frac{H_F}{2} \cdot A_s \cdot R = \left(\frac{H_F}{H_N}\right) \cdot Amp_0 \cdot \frac{R}{R_0}$$

$$\Delta Amp = \frac{(Amp - Amp_0)}{Amp_0} = \left(\frac{H_F}{H_N}\right)(1 + \Delta R) - 1 \quad \text{Equation 16}$$

In the case of a simple short (i.e., no magnetic shielding, $H_F = H_N$, and no magnetic shielding occurs:

$$\text{If } H_F = H_N : \frac{\Delta Amp}{\Delta R} = 1 \quad \text{Equation 17}$$

In the case where a magnetic shielding is present, $H_F = H_S < H_N$, magnetic shielding occurs. Thus, the signal is decreased even further as compared with a simple electrical short.

$$\text{If } H_F = H_S < H_N : |\Delta Amp| = \quad \text{Equation 18}$$
$$\left(1 - \left(\frac{H_S}{H_N}\right)\right) + \left(\frac{H_S}{H_N}\right) \cdot |\Delta R| = \left(1 - \frac{H_S}{H_N}\right) + \frac{H_S}{H_N} \cdot |\Delta R|$$

The above analytical model includes a both an electrical short and a decrease in the magnetic field reaching the sensor due to a magnetic shielding effect. This shows that, if the magnetic field is somehow decreased due to magnetic shielding, then with shielding, the ratio $$\frac{\Delta Amp}{\Delta R}$$

will be larger (as per Equation 18) than in the case of a simple conductive shunt (as per Equation 17).

Micromagnetic calculations were then done using a finite element model (FEM) including a magnetic shunt across the shields 1501 to 1502.

Figure 17A:
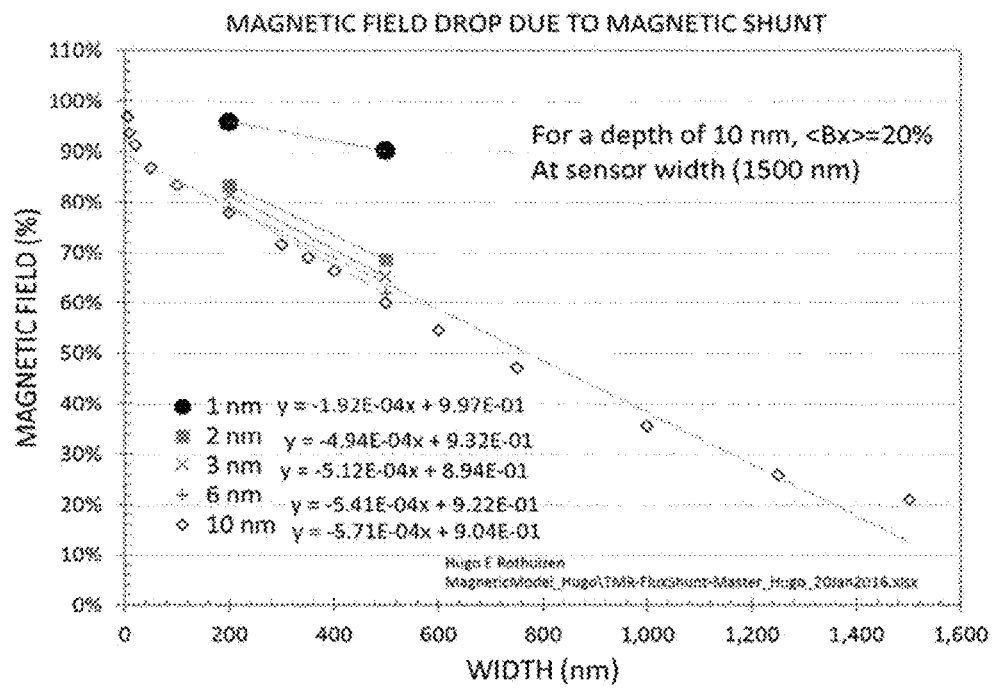
FIG. 17A is a plot of the drop in magnetic field inside of a TMR sensor with width of magnetic shunt having a thickness of 1 nm, 2 nm, 3 nm, 6 nm and 10 nm.
Figure 17B:
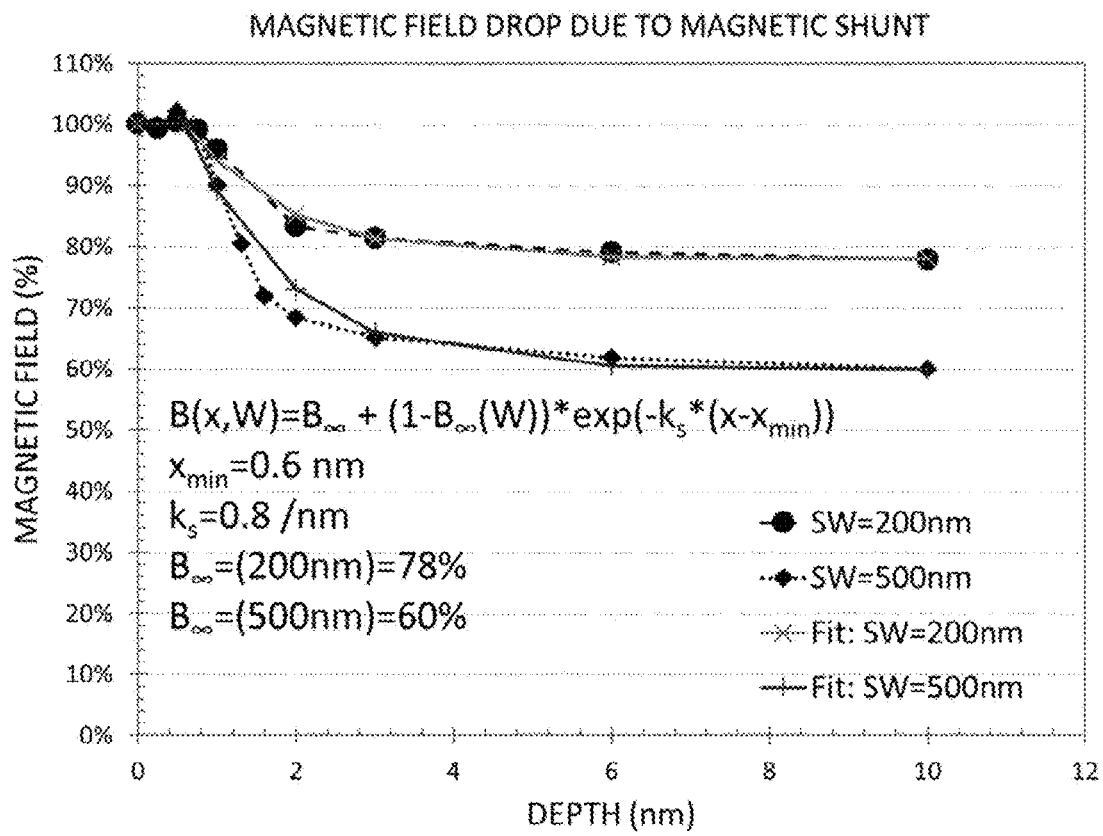
FIG. 17B is a plot of the drop in magnetic field inside of a TMR sensor versus permeability of the magnetic shunt for shunt widths of 200 nm and 500 nm.
Figure 17C:
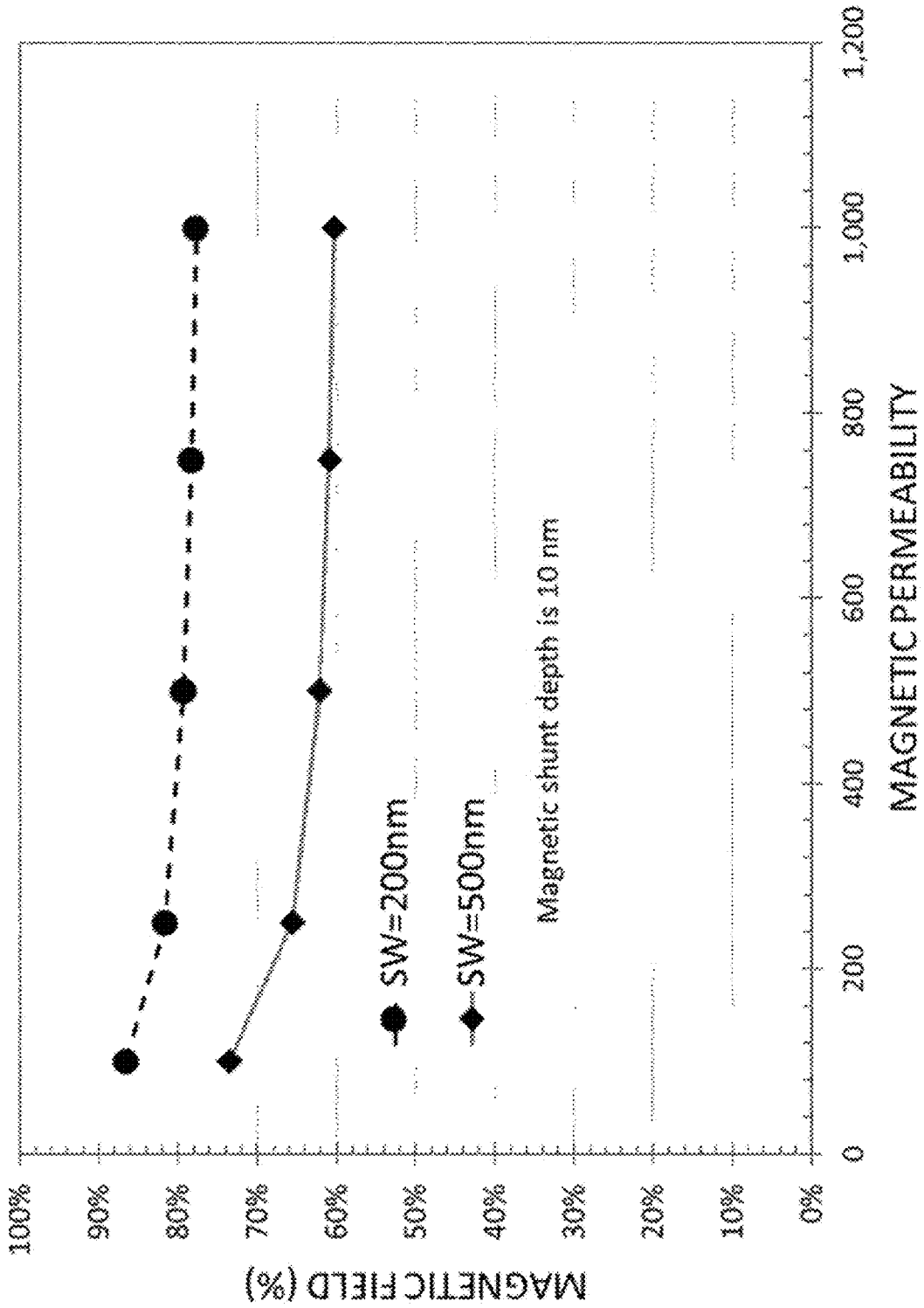
FIG. 17C is a plot of the drop in magnetic field inside of a TMR sensor versus the depth of the magnetic shunt for shunt widths of 200 nm and 500 nm.

FIG. 17A shows the drop in magnetic field inside a TMR sensor versus the width of the magnetic shunt for shunt thickness of 1 nm, 2 nm, 3 nm, 6 nm, and 10 nm. It should be noted that the sensor is 1500 nm wide, which is the same value used for the sensors for the experiments on scratching and dielectric breakdown. The magnetic field in the sensor drops essentially linearly with width of the magnetic shunt. FIG. 17B shows the drop in magnetic field inside the TMR sensor versus the depth (thickness) of the magnetic shunt for shunt widths of 200 nm and 500 nm. Note that the magnetic field loss saturates at around a 3 nm thick magnetic shunt. This model explains very well the drop in amplitude versus shunt resistance shown in FIG. 13. FIG. 17C shows a plot of the magnetic field inside TMR sensor versus permeability of the magnetic shunt for shunt widths of 200 nm and 500 nm.

More generally, a short due to a scratch from a particulate on the tape is expected to result in a drop in amplitude and the ratio of $$\frac{\Delta Amp}{\Delta R}$$

is significantly higher than the value of 1 expected for a simple parallel short across the tunnel junction which shunts current away from the TMR sensor and through the short. By contrast, a short due to a dielectric breakdown across the tunnel junction is expected to result in a drop in amplitude, wherein $$\frac{\Delta Amp}{\Delta R}$$

is close to the value of 1 expected for a simple parallel short. For a TMR sensor in a tape drive, when, $$\frac{\Delta Amp}{\Delta R} \geq dAdr_{Limit},$$

then the short is most likely cause by a scratch from a particle on the tape. When $$\frac{\Delta Amp}{\Delta R} < dAdr_{Limit},$$

then the short is most likely due to dielectric breakdown. A first choice for the limit, $dAdR_{Limit}$, is 1.7. A second choice of is $dAdR_{Limit}$ 2.0. For values of $$\frac{\Delta Amp}{\Delta R}$$

below 1.7, a magnetic shunt is unlikely. For values of $$\frac{\Delta Amp}{\Delta R}$$

between 1.7 and 2.0, dielectric breakdown is unlikely. In the case of a scratch, the voltage across the TMR sensor can be increased to the limits for unshorted TMRs, while in the case of dielectric breakdown, the voltage limit should be set low enough to avoid growth of the shorting pillar.

The drop in amplitude resulting from shorts across the tunnel junction at the air bearing surface causes by scratches at the air bearing surface from running tape drops more rapidly than expected from a parallel short. For $\Delta R_{TMR}$ above about −20%, the measured slope of ΔAmp versus resistance were all greater than 1.7, and several were between 2 and 3. Also, a plot of amplitude versus fractional current through the TMR sensor with a parallel short were fit with a power law with an exponent between 2 and 2.3 rather than a linear curve as expected for the ideal case.

Figure 2:
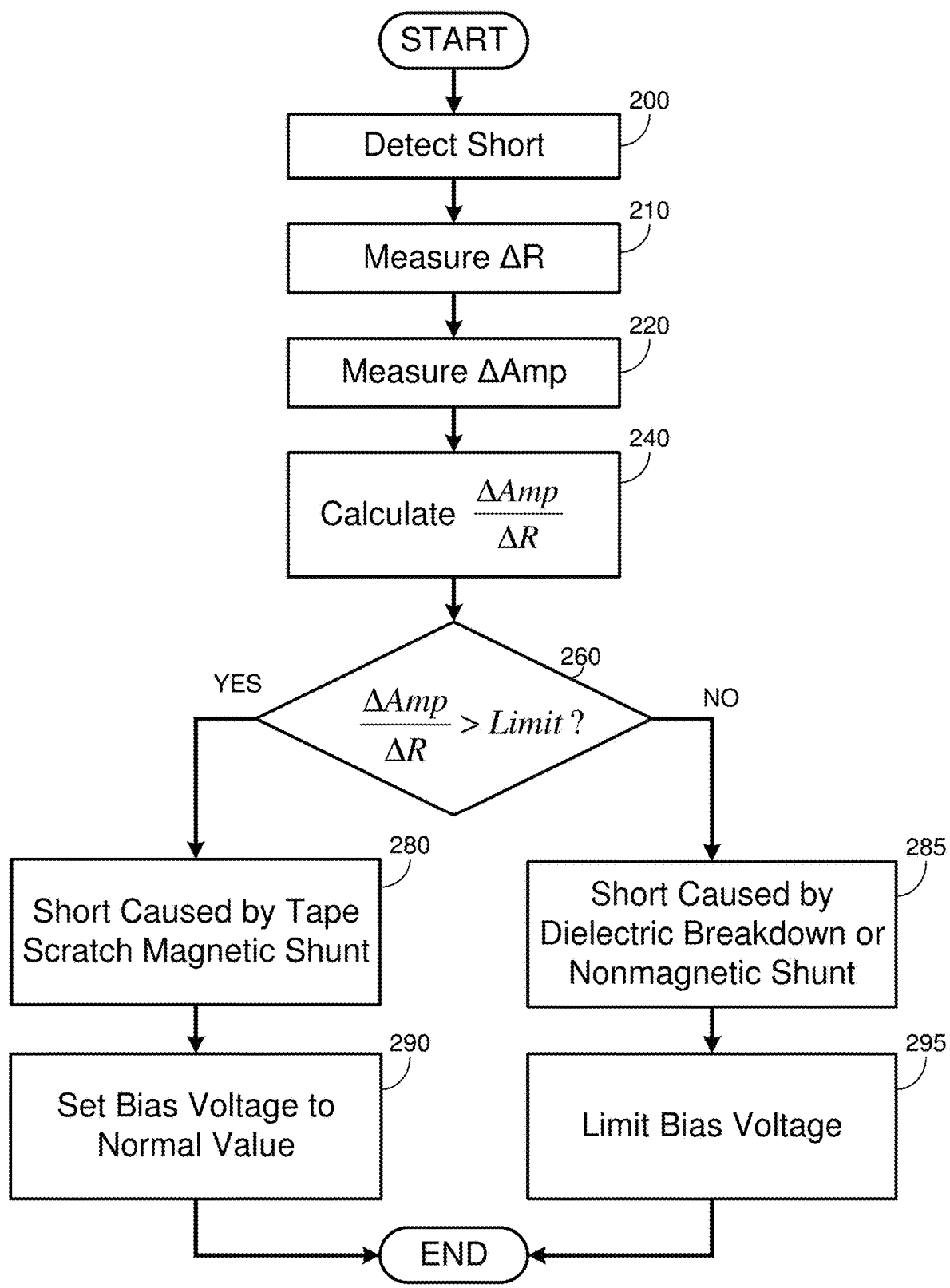
FIG. 2 is a flowchart depicting operational steps for a TMR diagnostic program, in accordance with at least one embodiment of the invention.

Referring now to the embodiment depicted in FIG. 2, FIG. 2 is a flowchart diagram for a TMR diagnostic program 101, in accordance with at least one embodiment of the present invention. In the depicted embodiment, at step 200, the TMR diagnostic program 101 detects a short across the TMR sensor 109. The TMR diagnostic program 101 may detect a short by monitoring resistance across the TMR sensor 109 (measurement of resistance may generally include a measurement with respect to the same device with a known resistance at an earlier time) and observing a sudden drop in resistance, which indicates that a new electric pathway (i.e., a short) has been made in the partially dielectric material of the TMR sensor 109. At step 210, the TMR diagnostic program 101 measures the change in resistance of the TMR sensor 109. The change in resistance is computed by taking the difference between the measured resistance after the short and the original resistance before the short. Normally, the change in resistance will have a negative sign, since the shunt normally causes resistance to drop.

Referring still to the embodiment depicted in FIG. 2, at step 220, the TMR diagnostic program 101 measures the change voltage amplitude for the TMR sensor 109. The change in voltage amplitude is computed by taking the difference between the measured voltage amplitude after the short and the original voltage amplitude before the short. Normally, the change in voltage amplitude will have a negative sign, as shown in FIG. 13.

Referring still to the embodiment depicted in FIG. 2, at step 240, the TMR diagnostic program divides the change in voltage amplitude by the change in resistance to yield a ratio. As in Equation 7, the theoretical expected value of the ratio is 1, however, as described above, the observed ratio is greater than one, and the inventors have observed and/or recognized that the value of the ratio is, at least in part, diagnostic as to the cause of failure in TMR sensors.

At decision block 260, the TMR diagnostic program 101 tests whether the ratio is greater than a limit. More generally, in the depicted embodiment, responsive to the ratio being greater than a predetermined threshold (decision block 260, YES branch), the TMR diagnostic program 101 determines, at step 280, that the short is caused by a magnetic shunt, for example by a tape scratch and/or lapping scratch. An exemplary value for the predetermined ratio is 1.7, wherein the inventors have observed and/or recognized that the method is diagnostic for some TMR sensors, in at least one embodiment of the invention. In alternative embodiments, functional values for the predetermined ratio for other TMR configurations, for example having different geometries, can be determined by engineers without undue experimentation, according to the models described herein. In addition to the ratio, the TMR diagnostic program 101 may require that the change in resistance and the change in voltage amplitude both be negative. By contrast, in the depicted embodiment, responsive to the ratio being less than the predetermined ratio threshold (decision block 260, NO branch), or, additionally, responsive to the either the change in resistance or the change in voltage amplitude being positive, the TMR diagnostic program 101 determines at step 285 that the short is caused by at least one of a dielectric breakdown and a nonmagnetic shunt.

Stated differently, in the embodiment depicted in in FIG. 2, for a TMR sensor used in a tape drive to read magnetic data from the tape, measure the change in the resistance, $\Delta R_{TMR}$, and the change in the amplitude, $\Delta Amp$, of a TMR sensor used in a tape drive from their initial values, and take the ratio, $$\frac{\Delta Amp}{\Delta R_{TMR}},$$

and if ΔAmp and $\Delta R_{TMR}$ are both negative and their ratio is larger than a given value, $dAdR_{Limit}$, then the shorting mechanism is a magnetic shunt from a scratch, and if the ratio is less than $dAdR_{Limit}$, then the short is due to dielectric breakdown or a non-magnetic shunt, where an exemplary value of $dAdr_{Limit}$ is 1.7.

Referring still to the embodiment depicted in FIG. 2, responsive to determining that the short is caused by a dielectric breakdown (step 285), the TMR diagnostic program 101, at step 295, limits a bias voltage across the TMR sensor to no greater than a voltage limit. The voltage limit is set at a value that is effective for protecting the dielectric breakdown from growing. An exemplary voltage limit for various contemplated embodiments is between 175 mV and 200 mV.

Referring still to the embodiment depicted in FIG. 2, responsive to determining that said short is caused by a magnetic shunt (step 280), the TMR diagnostic program 101, at step 290, sets a bias voltage across the TMR sensor to a normal value, which is effective in the absence of the short. An exemplary normal value for contemplated embodiments is between 200 mV and 300 mV.

Stated differently, if the cause of the drop in amplitude and resistance is determined to be due to a magnetic shunt, then the bias voltage across the TMR tunnel junction may be set to a value as would have been deemed safe (for example, by one of skill in the art for a particular embodiment) for a TMR tunnel junction prior to the development of the magnetic shunt. Similarly, if the cause of the drop in amplitude and resistance is determined to be due to a dielectric breakdown, then the bias voltage across the TMR tunnel junction may be set to a value which is lower than was previously deemed safe for a TMR sensor which had not undergone dielectric breakdown, and which is safe for a TMR sensor of the area and thickness of the TMR that has undergone dielectric breakdown.

In alternative embodiments, the TMR diagnostic program 101 measures the change in voltage amplitude as per step 220 over a range of values of the change in resistance. Correspondingly, at step 240, the TMR diagnostic program 101 determines the ratio over the range. Thus, in such embodiments, responsive to both: (i) the ratio is greater than the predetermined ratio threshold where the change in resistance than a predetermined drop threshold; and (ii) the ratio is less than the predetermined ratio threshold where the change in resistance is more negative than the predetermined resistance drop threshold, the TMR diagnostic program 101 determines that the short is caused by the magnetic shunt. An exemplary value for the predetermined drop threshold is −25%. In physical terms, if the voltage amplitude fails to continue to drop as fast as resistance across the TMR sensor, then it is possible to conclude that the shunt is not getting worse, and is therefore a magnetic shunt, and not a dielectric breakdown or nonmagnetic shunt.

Figure 3:
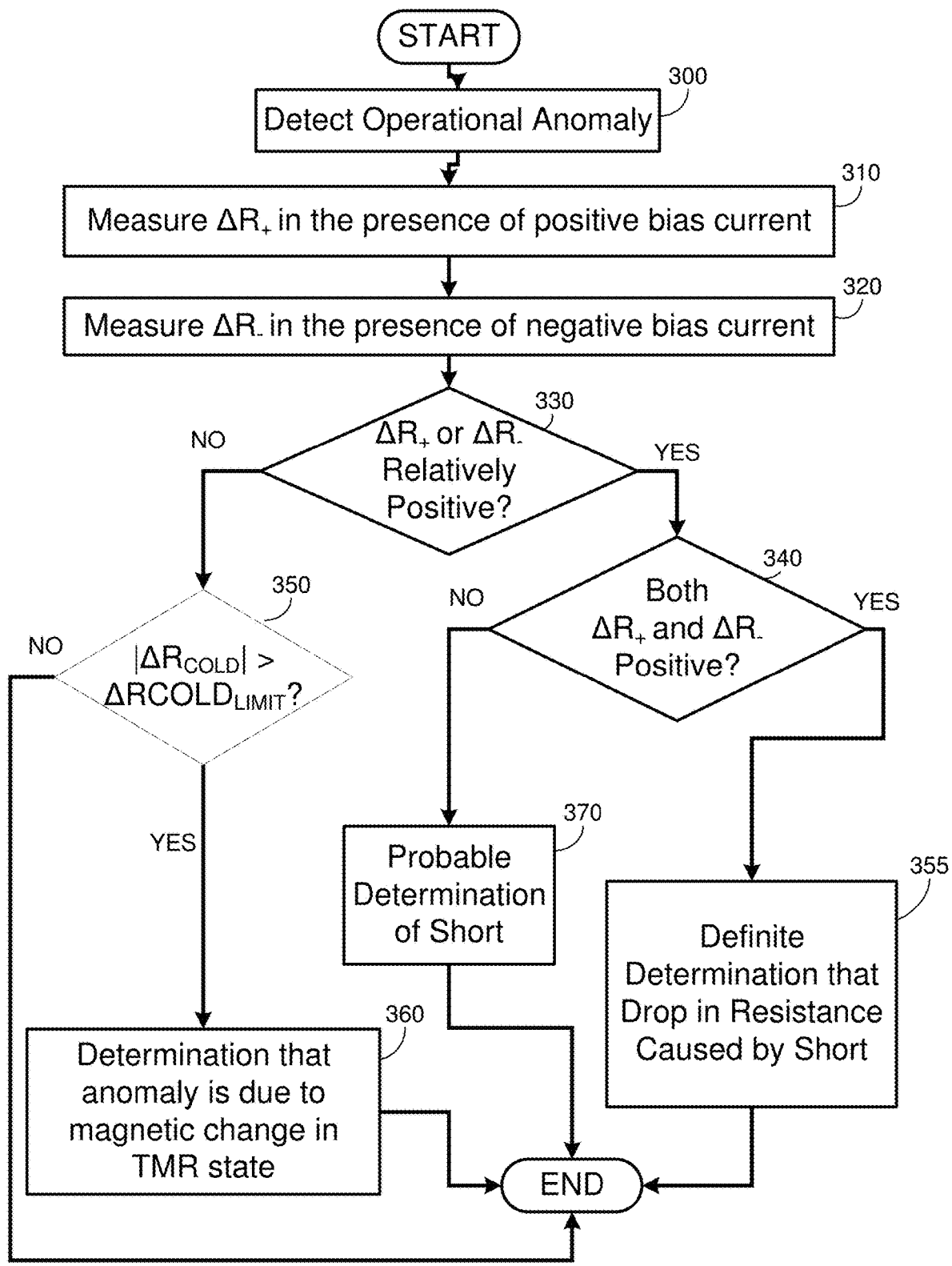
FIG. 3 is a flowchart diagram depicting alternative operational steps for a TMR diagnostic program, in accordance with at least one embodiment of the present invention.

Referring now to FIG. 3, FIG. 3 is a flowchart diagram of a TMR diagnostic program 101, in accordance with at least one embodiment of the present invention. For the depicted embodiment, the method may be understood to be performed by one or more processors in electronic communication with a TMR sensor. In one embodiment, the TMR sensor is installed in the read head of a magnetic tape drive. In another embodiment, the TMR sensor is installed in the read head of a hard disk drive. More generally, the TMR sensor may be a component of a magnetic storage drive configured to read magnetic data from a magnetic storage medium. In the depicted embodiment, at step 300, the TMR diagnostic program 101 detects an operational anomaly. An operational anomaly may include a general drop in resistance (according to any type of measurement) across the TMR sensor, as compared with an earlier time for the same TMR sensor or a TMR sensor of similar geometry. At a higher level, an operational anomaly may be detected in read errors or reduced performance of the reading device of which the TMR sensor is a component. For example, in a tape or hard disk drive, automated error correction may require multiple rereadings of the same data due to the operational anomaly, which can manifest in repetitive drive activity and delayed access times to data on disk or tape.

With reference to FIGS. 12A and 12B, the TMR diagnostic program 101 may, responsive to detecting the operational anomaly, detect a short using positive and negative bias currents. In a TMR sensor undamaged by a short, as per FIG. 12A, resistance is expected to decrease in the presence of a bias current with either polarity, however each polarity may behave differently with resistance dropping in differing amounts depending on the polarity of the bias current. By contrast, FIG. 12B shows resistance increasing with bias current in the presence of a short by joule heating, according to the principle that resistance in ordinary conductive materials increases with temperature. FIG. 12B shows an extreme case where an actual increase in resistance is observed with bias current, however more generally, a change in resistance that, even if negative, is more positive than expected is diagnostic of a short. The expected change in resistance can be modeled for a given device geometry. In the context of an implemented device in a tape drive, the expected device properties, including the expected resistance change under bias current of varying magnitude and polarity, can be known at design time and made available as parameters to the TMR diagnostic program 101.

More particularly, the TMR diagnostic program 101 may diagnose a short using bias currents by applying a first positive bias current across the TMR sensor, measuring a first positive resistance in the presence of the first positive bias current, applying a second positive bias current across the TMR sensor, measuring a second positive resistance change in the presence of the second positive bias current, determining a positive resistance change based on the first positive bias current and the second positive bias current (e.g., by computing the difference between them), applying a first negative bias current across the TMR sensor, measuring a first negative resistance change in the presence of said first negative bias current, applying a second negative bias current across the TMR sensor, measuring a second negative resistance in the presence of the second negative bias current, determining a negative resistance change based on the first negative bias current and the second negative bias current (e.g., by computing the difference between them), and, responsive to at least one of the positive resistance change and the negative resistance change being more positive than a predetermined short detection limit, determining that a short has been detected.

The predetermined short detection limit may be set based on the device properties and the desired conservativeness, according to engineering considerations. The first positive bias current and the second negative bias current may be set at a sufficiently low magnitude to effectively not affect measured resistance for said tunneling magnetoresistive sensor. The second positive bias current and second negative bias current may be set at a sufficiently greater magnitude than said first positive bias current to affect measured resistance for said tunneling magnetoresistive sensor. Still more particularly, the second positive bias current and second negative bias current may be of a magnitude that is less than an operational limit based on the device geometry and at least sufficiently great to consistently affect measured resistance for said tunneling magnetoresistive sensor.

At step 310, the TMR diagnostic program 101 applies a positive bias current across the TMR sensor and measures a first resistance change in the presence of the positive bias current. At step 320, the TMR diagnostic program 101 applies a negative bias current across the TMR sensor and measures a second resistance change in the presence of the negative bias current. In the context of the embodiment depicted in FIG. 3, "positive" and "negative" currents may be understood as currents in opposing directions, with an arbitrary selection of the direction in which the currents are opposed. Similarly, the invention may be applied to any two opposing directions of current regardless of whether current is modeled as a flow of negative electrons or as an opposing flow of positive current. Additionally, a resistance change may be generally understood as the difference between a pre-short measurement of the resistance of the TMR sensor and a measurement in the presence of the short and/or one or more other conditions.

Referring still to the embodiment depicted in FIG. 3, at decision block 330, the TMR diagnostic program 101 determines the sign of the change in resistance for the first and second changes in resistance. The sign of the change in resistance may be understood such that a positive change in resistance denotes an increase in resistance. The underlying physical mechanism for some shorts is that, where a thin electrically conductive bridge exists across the tunnel junction layer, applying a bias current in at least one direction will cause the thin bridge to heat up, which increases resistance. In the embodiment depicted in FIG. 3, at decision bock 340 (Decision block 330, YES branch), responsive to either the first resistance change being relatively positive or the second resistance change being relatively positive, at step 370 (decision block 340, NO branch) the TMR diagnostic program 101 returns a probable determination that the operational anomaly is caused by a short, such as an electrically conductive bridge (e.g., a pin-hole dielectric breakdown) across the tunnel junction layer of the tunneling magnetoresistive sensor.

Referring still to the embodiment depicted in FIG. 3, at decision block 340 (decision block 330, YES branch), the TMR diagnostic program 101 determines whether both of the first resistance change and the second resistance change are positive, which denotes a resistance increase for both polarities across the TMR sensor. Responsive to both the first resistance change being positive and the second resistance change being positive, at step 365, returning a definite determination that said short is caused by the electrically conductive bridge. As used herein, a probable determination may be understood generally as being less certain than a definite determination, and a definite determination may be understood as arbitrarily certain up to effectively absolute certainty. Thus, a probable determination implies relatively conservative engineering assumptions (whatever those may be for a particular embodiment) regarding protecting the TMR from further dielectric breakdown as compared with a definite determination.

Referring still to the embodiment of FIG. 3, stated differently, if the resistance of a TMR sensor's tunnel junction increases with bias current for either positive or negative current, then the TMR sensor most likely has a short. If the resistance of a TMR sensor's tunnel junction increases with bias current for both positive and negative current, then the TMR sensor conclusively has an electrically conductive short.

Referring still to the embodiment depicted in FIG. 3, at decision block 350 (decision block 340, NO branch), the TMR diagnostic program 101 tests whether the magnitude of the change in a measured value $R_{COLD}$ is greater than zero (where magnitude is expressed using the absolute value pipe symbol, given as $|\Delta R_{COLD}|$). $R_{COLD}$ may be understood as the measured resistance in the near absence of bias current. More specifically, due to the small scale of the TMR sensor, it is not possible to measure R with a truly neutral bias current because electric fields and currents are inherent at that scale. Thus, $R_{COLD}$ is measured when the effective bias current in the desired direction across the TMR sensor is brought as close to zero or neutral as possible. To achieve the change in $R_{COLD}$, the TMR diagnostic program 101 compares currently measured $R_{COLD}$ with a previously measured or expected $R_{COLD}$ for the TMR sensor prior to the operational anomaly. In cases where the previously measured value for the same device is not known, for example in a newly operational TMR sensor, $R_{COLD}$ may be compared with a measured value for a similar TMR sensor of similar geometry and composition. In the contemplated embodiment, the TMR diagnostic program 101 computes $|\Delta R_{COLD}|$ by taking the magnitude or absolute value (i.e., regardless of whether absolute resistance has increased or decreased) of $R_{COLD}$. The inventors have observed and/or recognized that a change in absolute resistance measured in the effective absence of bias current without a corresponding $\Delta R_+$ or $\Delta R_-$ (i.e., $|\Delta R_{COLD}| > \Delta R_{COLD_{LIMIT}}$, where $\Delta R_{COLD_{LIMIT}}$ is a near-zero positive predetermined limit value sufficient to distinguish effectively zero resistance change), is diagnostic as to a change in magnetic state of the TMR sensor as a whole device (step 360), which the inventors have observed to occur with some probability in TMR sensors. As a cause of a resistance drop, a change in magnetic state is understood by the inventors to be distinct from a short, however caused, and thus not necessarily requiring corrective action.

Figure 4:
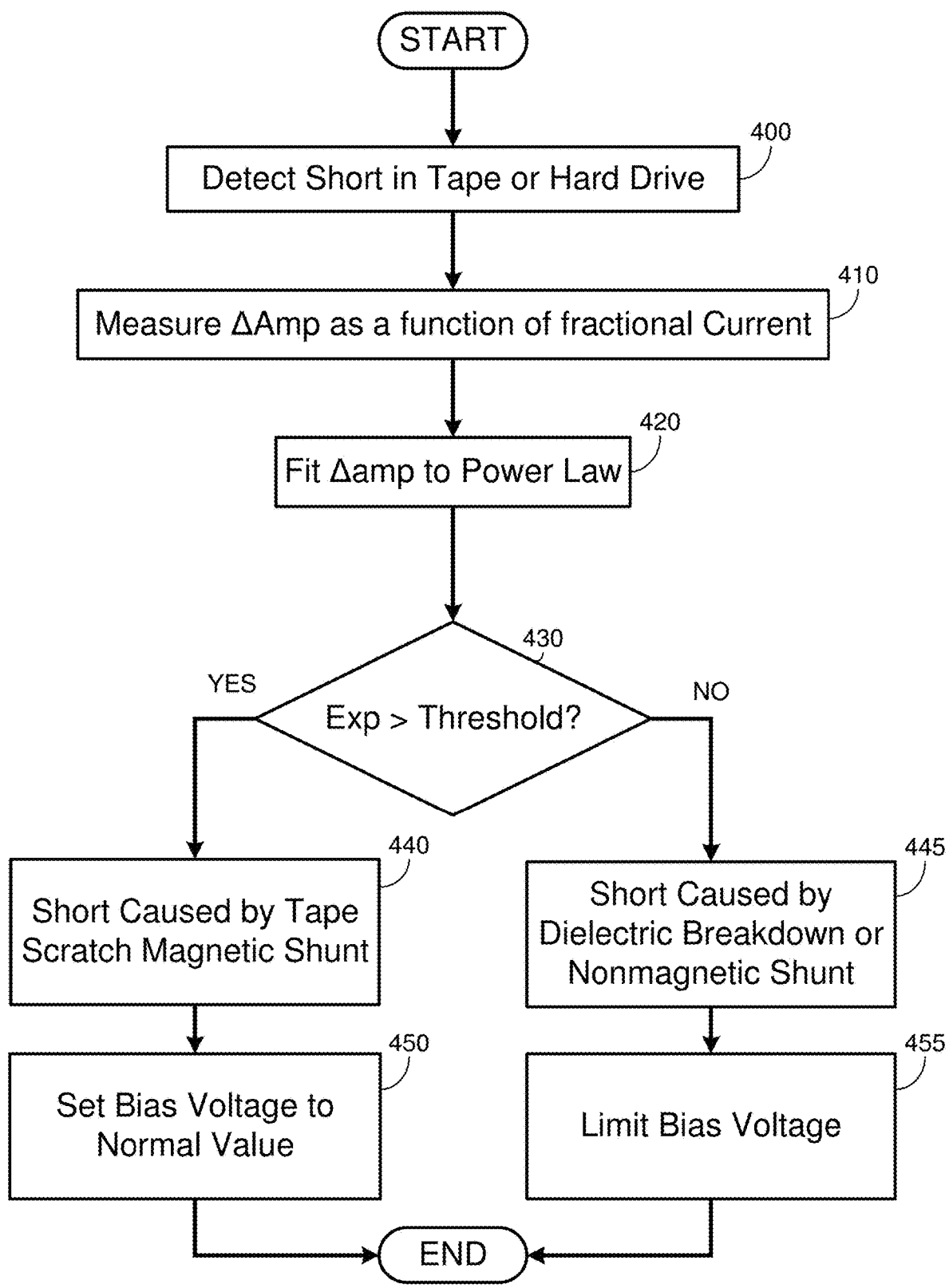
FIG. 4 is a flowchart diagram depicting alternative operational steps for a TMR diagnostic program, in accordance with at least one embodiment of the present invention.

Referring now to FIG. 4, FIG. 4 is a flowchart diagram for a TMR diagnostic program 101, in accordance with at least one embodiment of the present invention. For the depicted embodiment, the method is understood to be performed by one or more processors in electronic communication with a TMR sensor, wherein said tunneling magnetoresistive sensor is a component of a magnetic tape drive or hard disk configured to read magnetic data from a magnetic tape or hard disk. Diagnostically, the properties and inferences applied in a TMR diagnostic program 101 according to FIG. 4 rely upon the assumption of a physical model of a magnetic medium, specifically the tape or disk, running across the sensor in conjunction with detecting the below-described electrical properties. In the depicted embodiment, at step 400, the TMR diagnostic program 101 detects a short contemporaneously with the tape (or hard disk or other magnetic storage medium) running across the TMR sensor. It should be noted that contemporaneous operation permits a measurement of voltage amplitude across the TMR sensor, because the movement of the tape or other medium is what causes resistance, and thus measured voltage, to vary with time. By contrast, only stopping the motion of the tape or other medium permits static resistance of the TMR to be measured, because motion of the medium causes resistance to vary. As described above, the short is detected by observing a drop in resistance across the TMR sensor. At step 410, the TMR diagnostic program measures a voltage amplitude across the TMR sensor as a function of a fractional current through said tunneling magnetoresistive sensor to yield a voltage amplitude data set. At step 420, the TMR diagnostic program 101 fits the voltage amplitude data set to a power law using any function matching and/or regression technique.

If the resistance of a TMR sensor drops while running against tape, the inventors have observed and/or recognized that the short can be ascribed to a magnetic shunt shorting across the tunnel junction if the amplitude, Amp, versus fractional current through the TMR sensor, given by Equation 8, above, can be fit with the power law equation:

$$Amp_0 = \left(\frac{I_{TMR}}{I_0}\right)^\beta \qquad \text{Equation 19}$$

Where $\beta$ is greater than 2.5, and where $I_0$ is a fixed bias current. R is the resistance with the short, and $R_{TMR_o}$ is the TMR resistance prior to the short and $Amp_o$ is the amplitude measured with the bias current $I_o$ prior to the short. Also, thus, fractional current may be defined as a bias current multiplied by a measured resistance after the short and divided by an initial resistance prior to the short. Also, thus, the power law includes an initial voltage amplitude prior to the short multiplied by a ratio raised to the exponent. The ratio includes the fractional current divided by said bias current.

Referring still to the embodiment of FIG. 4, the TMR diagnostic program 101, at decision block 430, tests whether the exponent exceeds a threshold. As above, an exemplary range of the exponent threshold is between 2.0 and 2.5. At step 440, in the depicted embodiment, the TMR diagnostic program, responsive to the voltage amplitude data set fitting a power law, wherein the power law comprises an exponent, and wherein the exponent is greater than the exponent threshold, determines that the short is caused by a magnetic shunt. At step 450, the TMR diagnostic program set the bias current to a normal value, the normal value being effective in the absence of the short. As above, exemplary values of a normal value are between.

By contrast, where the exponent does not exceed the threshold, or where there is no power law fit, then, at step 445 (decision block 430, NO branch), the TMR diagnostic program 101 may conclude that the short is due to dielectric breakdown or a nonmagnetic shunt. Accordingly, at step 445, the TMR diagnostic program 101 may limit the bias voltage on the TMR sensor to a safe level, as described more particularly above.

In another embodiment of the invention, for TMR sensors installed in a read head of a tape drive, hard disk drive, or similar device, a TMR diagnostic program 101 measures the read-back amplitude, $Amp_m$ (i.e., voltage amplitude) and the resistance, $R_m$, for track m (wherein the read had includes multiple parallel tracks for reading from the tape, disk, or other magnetic storage medium). In such an embodiment a TMR diagnostic program 101 measures the average or median voltage amplitude, $\langle Amp \rangle$, and resistance, $\langle R \rangle$ for neighbor or all tracks in the read head. If for a given track, m, $(Amp_m - \langle Amp \rangle) < dAmP_{Error}$. That is, where $dAmP_{Error}$ is a predetermined value, and the ratio $$\frac{Amp_m - \langle Amp \rangle}{R_m - \langle R \rangle}$$

is greater than a predetermined value, $dAmpdR_{Limit}$, then the TMR diagnostic program determines that track m has suffered a short from a magnetic shunt.

Figure 18:
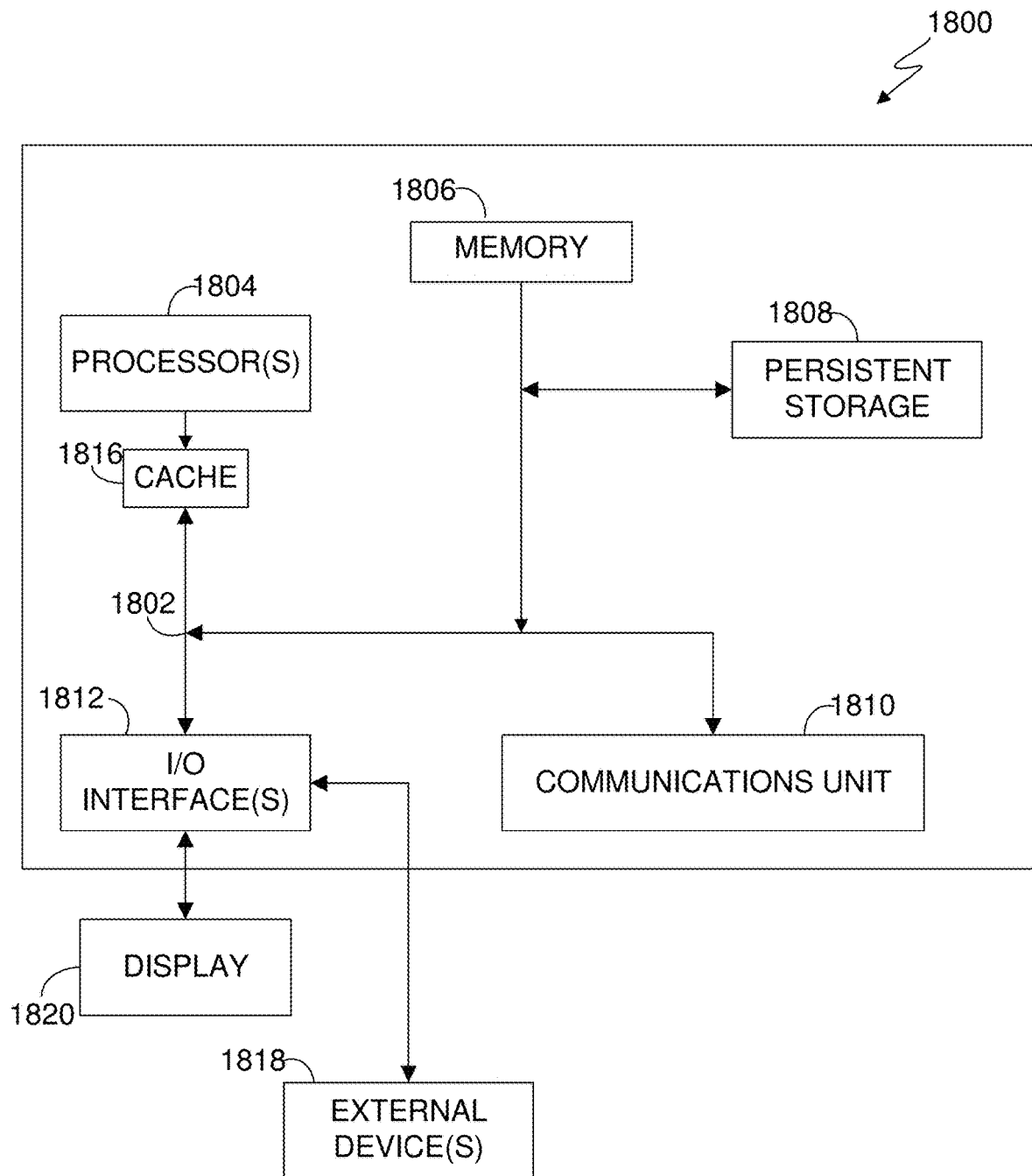
FIG. 18 is a block diagram depicting various logical elements for a computer system capable of executing program instructions, in accordance with at least one embodiment of the present invention.

FIG. 18 is a block diagram depicting components of a computer 1800 suitable for executing the TMR diagnostic program 101. FIG. 18 displays the computer 1800, the one or more processor(s) 1804 (including one or more computer processors), the communications fabric 1802, the memory 1806, the RAM, the cache 1816, the persistent storage 1808, the communications unit 1810, the I/O interfaces 1812, the display 1820, and the external devices 1818. It should be appreciated that FIG. 18 provides only an illustration of one embodiment and does not imply any limitations with regard to the environments in which different embodiments may be implemented. Many modifications to the depicted environment may be made.

As depicted, the computer 1800 operates over a communications fabric 1802, which provides communications between the cache 1816, the computer processor(s) 1804, the memory 1806, the persistent storage 1808, the communications unit 1810, and the input/output (I/O) interface(s) 1812. The communications fabric 1802 may be implemented with any architecture suitable for passing data and/or control information between the processors 1804 (e.g., microprocessors, communications processors, and network processors, etc.), the memory 1806, the external devices 1818, and any other hardware components within a system. For example, the communications fabric 1802 may be implemented with one or more buses or a crossbar switch.

The memory 1806 and persistent storage 1808 are computer readable storage media. In the depicted embodiment, the memory 1806 includes a random access memory (RAM). In general, the memory 1806 may include any suitable volatile or non-volatile implementations of one or more computer readable storage media. The cache 1816 is a fast memory that enhances the performance of computer processor(s) 1804 by holding recently accessed data, and data near accessed data, from memory 1806.

Program instructions for the TMR diagnostic program 101 may be stored in the persistent storage 1808 or in memory 1806, or more generally, any computer readable storage media, for execution by one or more of the respective computer processors 1804 via the cache 1816. The persistent storage 1808 may include a magnetic hard disk drive. Alternatively, or in addition to a magnetic hard disk drive, the persistent storage 1808 may include, a solid state hard disk drive, a semiconductor storage device, read-only memory (ROM), electronically erasable programmable read-only memory (EEPROM), flash memory, or any other computer readable storage media that is capable of storing program instructions or digital information.

The media used by the persistent storage 1808 may also be removable. For example, a removable hard drive may be used for persistent storage 1808. Other examples include optical and magnetic disks, thumb drives, and smart cards that are inserted into a drive for transfer onto another computer readable storage medium that is also part of the persistent storage 1808.

The communications unit 1810, in these examples, provides for communications with other data processing systems or devices. In these examples, the communications unit 1810 may include one or more network interface cards. The communications unit 1810 may provide communications through the use of either or both physical and wireless communications links. TMR diagnostic program 101 may be downloaded to the persistent storage 1808 through the communications unit 1810. In the context of some embodiments of the present invention, the source of the various input data may be physically remote to the computer 1800 such that the input data may be received and the output similarly transmitted via the communications unit 1810.

The I/O interface(s) 1812 allows for input and output of data with other devices that may operate in conjunction with the computer 1800. For example, the I/O interface 1812 may provide a connection to the external devices 1818, which may include a keyboard, keypad, a touch screen, and/or some other suitable input devices. External devices 1818 may also include portable computer readable storage media, for example, thumb drives, portable optical or magnetic disks, and memory cards. Software and data used to practice embodiments of the present invention may be stored on such portable computer readable storage media and may be loaded onto the persistent storage 1808 via the I/O interface(s) 1812. The I/O interface(s) 1812 may similarly connect to a display 1820. The display 1820 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
   detecting a short across a tunneling magnetoresistive sensor contemporaneously with a tape running across the tunneling magnetoresistive sensor;
   measuring a voltage amplitude across the tunneling magnetoresistive sensor as a function of a fractional current through the tunneling magnetoresistive sensor to yield a voltage amplitude data set, wherein the fractional current is a bias current multiplied by a measured resistance after the short and divided by an initial resistance prior to the short;
   fitting the voltage amplitude data set to a power law, wherein the power law comprises:
      an exponent that is greater than an exponent threshold; and
      an initial voltage amplitude prior to the short multiplied by a ratio raised to the exponent, the ratio comprising the fractional current divided by the bias current; and
   responsive to the voltage amplitude data set fitting the power law, determining that the short is caused by a magnetic shunt.

2. The method of claim 1, wherein the tunneling magnetoresistive sensor is a component of a magnetic tape drive configured to read magnetic data from a magnetic tape.

3. The method of claim 1, wherein the exponent threshold is between 2.0 and 2.5.

4. The method of claim 1, further comprising:
   responsive to determining that the short is caused by the magnetic shunt, setting a bias voltage across the tunneling magnetoresistive sensor to a normal value, the normal value being effective in the absence of the short.

5. A system comprising:
   a memory; and
   a processor communicatively coupled to the memory, wherein the processor is configured to perform a method comprising:
      detecting a short across a tunneling magnetoresistive sensor contemporaneously with a tape running across the tunneling magnetoresistive sensor;
      measuring a voltage amplitude across the tunneling magnetoresistive sensor as a function of a fractional current through the tunneling magnetoresistive sensor to yield a voltage amplitude data set, wherein the fractional current is a bias current multiplied by a measured resistance after the short and divided by an initial resistance prior to the short;
      fitting the voltage amplitude data set to a power law, wherein the power law comprises:
         an exponent that is greater than an exponent threshold; and
         an initial voltage amplitude prior to the short multiplied by a ratio raised to the exponent, the ratio comprising the fractional current divided by the bias current; and
      responsive to the voltage amplitude data set fitting the power law, determining that the short is caused by a magnetic shunt.

6. The system of claim 5, wherein the system further comprises a magnetic tape drive configured to read magnetic data from a magnetic tape, wherein the tunneling magnetoresistive sensor is a component of the magnetic tape drive.

7. The system of claim 5, wherein the exponent threshold is between 2.0 and 2.5.

8. The system of claim 5, wherein the method further comprises:
   responsive to determining that the short is caused by the magnetic shunt, setting a bias voltage across the tunneling magnetoresistive sensor to a normal value, the normal value being effective in the absence of the short.

9. A computer program product comprising a computer readable storage medium having program instructions embodied therewith, the program instructions executable by processor to cause the processor to perform a method comprising:
   detecting a short across a tunneling magnetoresistive sensor contemporaneously with a tape running across the tunneling magnetoresistive sensor;
   measuring a voltage amplitude across the tunneling magnetoresistive sensor as a function of a fractional current through the tunneling magnetoresistive sensor to yield a voltage amplitude data set, wherein the fractional current is a bias current multiplied by a measured resistance after the short and divided by an initial resistance prior to the short;
   fitting the voltage amplitude data set to a power law, wherein the power law comprises:
      an exponent that is greater than an exponent threshold; and
      an initial voltage amplitude prior to the short multiplied by a ratio raised to the exponent, the ratio comprising the fractional current divided by the bias current; and
   responsive to the voltage amplitude data set fitting the power law, determining that the short is caused by a magnetic shunt.

10. The computer program product of claim 9, wherein the tunneling magnetoresistive sensor is a component of a magnetic tape drive configured to read magnetic data from a magnetic tape.

11. The computer program product of claim 9, wherein the method further comprises:
    responsive to determining that the short is caused by the magnetic shunt, setting a bias voltage across the tunneling magnetoresistive sensor to a normal value, the normal value being effective in the absence of the short.

* * * * *